United States Patent
Shaw et al.

(10) Patent No.: US 10,228,770 B2
(45) Date of Patent: *Mar. 12, 2019

(54) INPUT DEVICE CONFIGURATION HAVING CAPACITIVE AND PRESSURE SENSORS

(71) Applicant: Microsoft Technology Licensing, LLC, Redmond, WA (US)

(72) Inventors: Timothy C. Shaw, Austin, TX (US); James C. Marshall, Puyallup, WA (US); Brian R. Cox, Seattle, WA (US); Carl E. Picciotto, Clyde Hill, WA (US); Aric A. Fitz-Coy, Seattle, WA (US)

(73) Assignee: MICROSOFT TECHNOLOGY LICENSING, LLC, Redmond, WA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/600,607

(22) Filed: May 19, 2017

(65) Prior Publication Data

US 2017/0255276 A1 Sep. 7, 2017

Related U.S. Application Data

(63) Continuation of application No. 14/033,510, filed on Sep. 22, 2013, now Pat. No. 9,684,382, which is a
(Continued)

(51) Int. Cl.
*G06F 3/023* (2006.01)
*G06F 1/16* (2006.01)
(Continued)

(52) U.S. Cl.
CPC ............ *G06F 3/023* (2013.01); *G06F 1/1632* (2013.01); *G06F 1/1669* (2013.01);
(Continued)

(58) Field of Classification Search
CPC ...... G06F 3/023; G06F 1/1632; G06F 1/1669; G06F 3/0488; G06F 3/0202;
(Continued)

(56) References Cited

U.S. PATENT DOCUMENTS

| 578,325 A | 3/1897 | Fleming |
| 4,046,975 A | 9/1977 | Seeger, Jr. |

(Continued)

FOREIGN PATENT DOCUMENTS

| CN | 102117121 | 7/2011 |
| CN | 102292687 | 12/2011 |

(Continued)

OTHER PUBLICATIONS

"Accessing Device Sensors", retrieved from <https://developer.palm.com/content/api/dev-guide/pdk/accessing-device-sensors.html> on May 25, 2012, 2011, 4 pages.

(Continued)

*Primary Examiner* — Richard J Hong
(74) *Attorney, Agent, or Firm* — Alleman Hall Creasman & Tutte LLP

(57) ABSTRACT

Input device configurations are described. In one or more implementations, an input device includes a sensor substrate having one or more conductors and a flexible contact layer spaced apart from the sensor substrate. The flexible contact layer is configured to flex to contact the sensor substrate to initiate an input of a computing device. In one or more implementations, an input device includes a capacitive sensor assembly arranged in an array that is configured to detect a location of an object that is proximal to a respective capacitive sensor of the capacitive sensor assembly and a pressure sensitive sensor assembly including a plurality of pressure sensitive sensor nodes that are configured to detect an amount of pressure applied by the object against a (Continued)

respective pressure sensitive sensor node of the pressure sensitive sensor assembly.

16 Claims, 11 Drawing Sheets

Related U.S. Application Data continuation-in-part of application No. 13/974,749, filed on Aug. 23, 2013, which is a continuation-in-part of application No. 13/655,065, filed on Oct. 18, 2012, now abandoned.

(60) Provisional application No. 61/659,364, filed on Jun. 13, 2012.

(51) Int. Cl.
| | |
|---|---|
| *G06F 3/02* | (2006.01) |
| *G06F 3/041* | (2006.01) |
| *G06F 3/044* | (2006.01) |
| *H01H 13/702* | (2006.01) |
| *H03K 17/96* | (2006.01) |

(52) U.S. Cl.
CPC ............ *G06F 3/0202* (2013.01); *G06F 3/044* (2013.01); *G06F 3/0414* (2013.01); *H01H 13/702* (2013.01); *H03K 17/962* (2013.01); *H01H 2203/02* (2013.01); *H01H 2205/004* (2013.01); *H01H 2209/006* (2013.01); *H01H 2211/03* (2013.01); *H01H 2219/036* (2013.01); *H01H 2219/062* (2013.01); *H01H 2221/05* (2013.01); *H01H 2223/003* (2013.01); *H01H 2231/002* (2013.01); *H03K 2217/960755* (2013.01); *H03K 2217/960785* (2013.01)

(58) Field of Classification Search
CPC ... G06F 3/0414; G06F 3/044; H01H 2203/02; H01H 2205/004; H01H 13/702; H01H 2209/006; H01H 2211/03; H01H 2219/036; H01H 2219/062; H01H 2221/05; H01H 2223/003; H01H 2231/002; H03K 17/962; H03K 2217/960755; H03K 2217/960785
See application file for complete search history.

(56) References Cited

U.S. PATENT DOCUMENTS

| | | | |
|---|---|---|---|
| 4,065,649 A | 12/1977 | Carter et al. |
| 4,243,861 A | 1/1981 | Strandwitz |
| 4,279,021 A | 7/1981 | See et al. |
| 4,302,648 A | 11/1981 | Sado et al. |
| 4,317,013 A | 2/1982 | Larson |
| 4,326,193 A | 4/1982 | Markley et al. |
| 4,365,130 A | 12/1982 | Christensen |
| 4,492,829 A | 1/1985 | Rodrique |
| 4,527,021 A | 7/1985 | Morikawa et al. |
| 4,559,426 A | 12/1985 | Van Zeeland et al. |
| 4,577,822 A | 3/1986 | Wilkerson |
| 4,588,187 A | 5/1986 | Dell |
| 4,607,147 A | 8/1986 | Ono et al. |
| 4,651,133 A | 3/1987 | Ganesan et al. |
| 4,735,394 A | 4/1988 | Facco |
| 4,890,832 A | 1/1990 | Komaki |
| 5,149,923 A | 9/1992 | Demeo |
| 5,220,521 A | 6/1993 | Kikinis |
| 5,283,559 A | 2/1994 | Kalendra et al. |
| 5,331,443 A | 7/1994 | Stanisci |
| 5,480,118 A | 1/1996 | Cross |
| 5,489,900 A | 2/1996 | Cali et al. |
| 5,510,783 A | 4/1996 | Findlater et al. |
| 5,546,271 A | 8/1996 | Gut et al. |
| 5,548,477 A | 8/1996 | Kumar et al. |
| 5,558,577 A | 9/1996 | Kato |
| 5,576,981 A | 11/1996 | Parker et al. |
| 5,617,343 A | 4/1997 | Danielson et al. |
| 5,618,232 A | 4/1997 | Martin |
| 5,681,220 A | 10/1997 | Bertram et al. |
| 5,745,376 A | 4/1998 | Barker et al. |
| 5,748,114 A | 5/1998 | Koehn |
| 5,781,406 A | 7/1998 | Hunte |
| 5,807,175 A | 9/1998 | Davis et al. |
| 5,818,361 A | 10/1998 | Acevedo |
| 5,828,770 A | 10/1998 | Leis et al. |
| 5,842,027 A | 11/1998 | Oprescu et al. |
| 5,859,642 A | 1/1999 | Jones |
| 5,874,697 A | 2/1999 | Selker et al. |
| 5,909,211 A | 6/1999 | Combs et al. |
| 5,926,170 A | 7/1999 | Oba |
| 5,942,733 A | 8/1999 | Allen et al. |
| 5,971,635 A | 10/1999 | Wise |
| 6,002,389 A | 12/1999 | Kasser |
| 6,005,209 A | 12/1999 | Burleson et al. |
| 6,012,714 A | 1/2000 | Worley et al. |
| 6,040,823 A | 3/2000 | Seffernick et al. |
| 6,044,717 A | 4/2000 | Biegelsen et al. |
| 6,061,644 A | 5/2000 | Leis |
| 6,112,797 A | 9/2000 | Colson et al. |
| 6,147,859 A | 11/2000 | Abboud |
| 6,177,926 B1 | 1/2001 | Kunert |
| 6,178,443 B1 | 1/2001 | Lin |
| 6,239,786 B1 | 5/2001 | Burry et al. |
| 6,254,105 B1 | 7/2001 | Rinde et al. |
| 6,279,060 B1 | 8/2001 | Luke et al. |
| 6,329,617 B1 | 12/2001 | Burgess |
| 6,344,791 B1 | 2/2002 | Armstrong |
| 6,380,497 B1 | 4/2002 | Hashimoto et al. |
| 6,429,846 B2 | 8/2002 | Rosenberg et al. |
| 6,437,682 B1 | 8/2002 | Vance |
| 6,506,983 B1 | 1/2003 | Babb et al. |
| 6,511,378 B1 | 1/2003 | Bhatt et al. |
| 6,532,147 B1 | 3/2003 | Christ, Jr. |
| 6,543,949 B1 | 4/2003 | Ritchey et al. |
| 6,565,439 B2 | 5/2003 | Shinohara et al. |
| 6,597,347 B1 | 7/2003 | Yasutake |
| 6,600,121 B1 | 7/2003 | Olodort et al. |
| 6,603,408 B1 | 8/2003 | Gaba |
| 6,617,536 B2 | 9/2003 | Kawaguchi |
| 6,651,943 B2 | 11/2003 | Cho et al. |
| 6,685,369 B2 | 2/2004 | Lien |
| 6,695,273 B2 | 2/2004 | Iguchi |
| 6,704,864 B1 | 3/2004 | Philyaw |
| 6,721,019 B2 | 4/2004 | Kono et al. |
| 6,725,318 B1 | 4/2004 | Sherman et al. |
| 6,738,049 B2 | 5/2004 | Kiser et al. |
| 6,758,615 B2 | 7/2004 | Monney et al. |
| 6,774,888 B1 | 8/2004 | Genduso |
| 6,776,546 B2 | 8/2004 | Kraus et al. |
| 6,781,819 B2 | 8/2004 | Yang et al. |
| 6,784,869 B1 | 8/2004 | Clark et al. |
| 6,813,143 B2 | 11/2004 | Makela |
| 6,819,316 B2 | 11/2004 | Schulz et al. |
| 6,856,506 B2 | 2/2005 | Doherty et al. |
| 6,861,961 B2 | 3/2005 | Sandbach et al. |
| 6,864,573 B2 | 3/2005 | Robertson et al. |
| 6,898,315 B2 | 5/2005 | Guha |
| 6,914,197 B2 | 7/2005 | Doherty et al. |
| 6,950,950 B2 | 9/2005 | Sawyers et al. |
| 6,970,957 B1 | 11/2005 | Oshins et al. |
| 6,976,799 B2 | 12/2005 | Kim et al. |
| 6,977,352 B2 | 12/2005 | Oosawa |
| 7,051,149 B2 | 5/2006 | Wang et al. |
| 7,083,295 B1 | 8/2006 | Hanna |
| 7,091,436 B2 | 8/2006 | Serban |
| 7,091,955 B2 | 8/2006 | Kramer |
| 7,095,404 B2 | 8/2006 | Vincent et al. |
| 7,106,222 B2 | 9/2006 | Ward et al. |
| 7,116,309 B1 | 10/2006 | Kimura et al. |
| 7,123,292 B1 | 10/2006 | Seeger et al. |
| 7,194,662 B2 | 3/2007 | Do et al. |

(56) References Cited

U.S. PATENT DOCUMENTS

| | | |
|---|---|---|
| 7,202,837 B2 | 4/2007 | Ihara |
| 7,213,991 B2 | 5/2007 | Chapman et al. |
| 7,224,830 B2 | 5/2007 | Nefian et al. |
| 7,245,292 B1 | 7/2007 | Custy |
| 7,277,087 B2 | 10/2007 | Hill et al. |
| 7,280,348 B2 | 10/2007 | Ghosh |
| 7,301,759 B2 | 11/2007 | Hsiung |
| 7,374,312 B2 | 5/2008 | Feng et al. |
| 7,401,992 B1 | 7/2008 | Lin |
| 7,423,557 B2 | 9/2008 | Kang |
| 7,446,276 B2 | 11/2008 | Piesko |
| 7,447,934 B2 | 11/2008 | Dasari et al. |
| 7,469,386 B2 | 12/2008 | Bear et al. |
| 7,486,165 B2 | 2/2009 | Ligtenberg et al. |
| 7,499,037 B2 | 3/2009 | Lube |
| 7,502,803 B2 | 3/2009 | Culter et al. |
| 7,542,052 B2 | 6/2009 | Solomon et al. |
| 7,557,312 B2 | 7/2009 | Clark et al. |
| 7,558,594 B2 | 7/2009 | Wilson |
| 7,559,834 B1 | 7/2009 | York |
| RE40,891 E | 9/2009 | Yasutake |
| 7,602,384 B2 | 10/2009 | Rosenberg et al. |
| 7,620,244 B1 | 11/2009 | Collier |
| 7,622,907 B2 | 11/2009 | Vranish |
| 7,636,921 B2 | 12/2009 | Louie |
| 7,639,876 B2 | 12/2009 | Clary et al. |
| 7,656,392 B2 | 2/2010 | Bolender |
| 7,686,694 B2 | 3/2010 | Cole |
| 7,728,820 B2 | 6/2010 | Rosenberg et al. |
| 7,728,923 B2 | 6/2010 | Kim et al. |
| 7,731,147 B2 | 6/2010 | Rha |
| 7,733,326 B1 | 6/2010 | Adiseshan |
| 7,736,042 B2 | 6/2010 | Park et al. |
| 7,773,076 B2 | 8/2010 | Pittel et al. |
| 7,773,121 B1 | 8/2010 | Huntsberger et al. |
| 7,774,155 B2 | 8/2010 | Sato et al. |
| 7,777,972 B1 | 8/2010 | Chen et al. |
| 7,782,342 B2 | 8/2010 | Koh |
| 7,813,715 B2 | 10/2010 | McKillop et al. |
| 7,815,358 B2 | 10/2010 | Inditsky |
| 7,817,428 B2 | 10/2010 | Greer, Jr. et al. |
| 7,865,639 B2 | 1/2011 | McCoy et al. |
| 7,884,807 B2 | 2/2011 | Hovden et al. |
| 7,907,394 B2 | 3/2011 | Richardson et al. |
| D636,397 S | 4/2011 | Green |
| 7,928,964 B2 | 4/2011 | Kolmykov-Zotov et al. |
| 7,936,501 B2 | 5/2011 | Smith et al. |
| 7,945,717 B2 | 5/2011 | Rivalsi |
| 7,952,566 B2 | 5/2011 | Poupyrev et al. |
| 7,970,246 B2 | 6/2011 | Travis et al. |
| 7,973,771 B2 | 7/2011 | Geaghan |
| 7,976,393 B2 | 7/2011 | Haga et al. |
| 7,978,281 B2 | 7/2011 | Vergith et al. |
| 8,016,255 B2 | 9/2011 | Lin |
| 8,018,386 B2 | 9/2011 | Qi et al. |
| 8,018,579 B1 | 9/2011 | Krah |
| 8,022,939 B2 | 9/2011 | Hinata |
| 8,026,904 B2 | 9/2011 | Westerman |
| 8,053,688 B2 | 11/2011 | Conzola et al. |
| 8,063,886 B2 | 11/2011 | Serban et al. |
| 8,065,624 B2 | 11/2011 | Morin et al. |
| 8,069,356 B2 | 11/2011 | Rathi et al. |
| 8,077,160 B2 | 12/2011 | Land et al. |
| 8,090,885 B2 | 1/2012 | Callaghan et al. |
| 8,094,134 B2 | 1/2012 | Suzuki et al. |
| 8,098,233 B2 | 1/2012 | Hotelling et al. |
| 8,115,499 B2 | 2/2012 | Osoinach et al. |
| 8,117,362 B2 | 2/2012 | Rodriguez et al. |
| 8,118,274 B2 | 2/2012 | McClure et al. |
| 8,118,681 B2 | 2/2012 | Mattice et al. |
| 8,130,203 B2 | 3/2012 | Westerman |
| 8,154,524 B2 | 4/2012 | Wilson et al. |
| 8,162,282 B2 | 4/2012 | Hu et al. |
| D659,139 S | 5/2012 | Gengler |
| 8,169,421 B2 | 5/2012 | Wright et al. |
| 8,189,973 B2 | 5/2012 | Travis et al. |
| 8,216,074 B2 | 7/2012 | Sakuma |
| 8,229,509 B2 | 7/2012 | Paek et al. |
| 8,229,522 B2 | 7/2012 | Kim et al. |
| 8,232,963 B2 | 7/2012 | Orsley et al. |
| 8,267,368 B2 | 9/2012 | Torii et al. |
| 8,269,093 B2 | 9/2012 | Naik et al. |
| 8,274,784 B2 | 9/2012 | Franz et al. |
| 8,279,589 B2 | 10/2012 | Kim |
| 8,279,623 B2 | 10/2012 | Idzik et al. |
| 8,322,290 B1 | 12/2012 | Mignano |
| 8,330,061 B2 | 12/2012 | Rothkopf et al. |
| 8,330,742 B2 | 12/2012 | Reynolds et al. |
| 8,378,972 B2 | 2/2013 | Pance et al. |
| 8,403,576 B2 | 3/2013 | Merz |
| 8,416,559 B2 | 4/2013 | Agata et al. |
| 8,487,751 B2 | 7/2013 | Laitinen et al. |
| 8,498,100 B1 | 7/2013 | Whitt, III et al. |
| D696,253 S | 12/2013 | Akana et al. |
| 8,607,651 B2 | 12/2013 | Eventoff |
| 8,633,916 B2 | 1/2014 | Bernstein et al. |
| 8,638,315 B2 | 1/2014 | Algreatly |
| 8,659,555 B2 | 2/2014 | Pihlaja |
| 8,674,961 B2 | 3/2014 | Posamentier |
| D704,702 S | 5/2014 | Akana et al. |
| 8,757,374 B1 | 6/2014 | Kaiser |
| 8,766,925 B2 | 7/2014 | Perlin et al. |
| 8,831,677 B2 | 9/2014 | Villa-Real |
| 8,836,664 B2 | 9/2014 | Colgate et al. |
| 8,847,895 B2 | 9/2014 | Lim et al. |
| 8,847,897 B2 | 9/2014 | Sakai et al. |
| 8,854,331 B2 | 10/2014 | Heubel et al. |
| 8,928,581 B2 | 1/2015 | Braun et al. |
| 8,970,525 B1 | 3/2015 | D Los Reyes |
| 9,047,012 B1 | 6/2015 | Bringert et al. |
| 9,063,693 B2 | 6/2015 | Raken et al. |
| 9,073,123 B2 | 7/2015 | Campbell et al. |
| 9,098,304 B2 | 8/2015 | Young et al. |
| 9,176,538 B2 | 11/2015 | Boulanger |
| 9,189,428 B2 | 11/2015 | Pollmann et al. |
| 9,348,605 B2 | 5/2016 | Drasnin |
| 9,360,893 B2 | 6/2016 | Bathiche et al. |
| 9,411,436 B2 | 8/2016 | Shaw et al. |
| 9,448,631 B2 | 9/2016 | Winter et al. |
| 9,459,160 B2 | 10/2016 | Shaw et al. |
| 9,684,382 B2 | 6/2017 | Shaw et al. |
| 2001/0035859 A1 | 11/2001 | Kiser |
| 2002/0000977 A1 | 1/2002 | Vranish |
| 2002/0126445 A1 | 9/2002 | Minaguchi et al. |
| 2002/0134828 A1 | 9/2002 | Sandbach et al. |
| 2002/0154099 A1 | 10/2002 | Oh |
| 2002/0188721 A1 | 12/2002 | Lemel et al. |
| 2003/0016282 A1 | 1/2003 | Koizumi |
| 2003/0044215 A1 | 3/2003 | Monney et al. |
| 2003/0083131 A1 | 5/2003 | Armstrong |
| 2003/0132916 A1 | 7/2003 | Kramer |
| 2003/0163611 A1 | 8/2003 | Nagao |
| 2003/0197687 A1 | 10/2003 | Shetter |
| 2003/0201982 A1 | 10/2003 | Iesaka |
| 2004/0005184 A1 | 1/2004 | Kim et al. |
| 2004/0100457 A1 | 5/2004 | Mandle |
| 2004/0140998 A1 | 7/2004 | Gravina et al. |
| 2004/0174670 A1 | 9/2004 | Huang et al. |
| 2004/0190239 A1 | 9/2004 | Weng et al. |
| 2004/0212598 A1 | 10/2004 | Kraus et al. |
| 2004/0258924 A1 | 12/2004 | Berger et al. |
| 2004/0267323 A1 | 12/2004 | Dupelle |
| 2004/0268000 A1 | 12/2004 | Barker et al. |
| 2005/0030728 A1 | 2/2005 | Kawashima et al. |
| 2005/0057515 A1 | 3/2005 | Bathiche |
| 2005/0057521 A1 | 3/2005 | Aull et al. |
| 2005/0059441 A1 | 3/2005 | Miyashita |
| 2005/0059489 A1 | 3/2005 | Kim |
| 2005/0146512 A1 | 7/2005 | Hill et al. |
| 2005/0190159 A1 | 9/2005 | Skarine |
| 2005/0240949 A1 | 10/2005 | Liu et al. |
| 2005/0264653 A1 | 12/2005 | Starkweather et al. |
| 2005/0264988 A1 | 12/2005 | Nicolosi |
| 2005/0285703 A1 | 12/2005 | Wheeler et al. |

(56) References Cited

U.S. PATENT DOCUMENTS

| | | |
|---|---|---|
| 2006/0049993 A1 | 3/2006 | Lin et al. |
| 2006/0082973 A1 | 4/2006 | Egbert et al. |
| 2006/0085658 A1 | 4/2006 | Allen et al. |
| 2006/0102914 A1 | 5/2006 | Smits et al. |
| 2006/0103633 A1 | 5/2006 | Gioeli |
| 2006/0125799 A1 | 6/2006 | Hillis et al. |
| 2006/0132423 A1 | 6/2006 | Travis |
| 2006/0154725 A1 | 7/2006 | Glaser et al. |
| 2006/0156415 A1 | 7/2006 | Rubinstein et al. |
| 2006/0158433 A1 | 7/2006 | Serban et al. |
| 2006/0181514 A1 | 8/2006 | Newman |
| 2006/0181521 A1 | 8/2006 | Perreault et al. |
| 2006/0187216 A1 | 8/2006 | Trent, Jr. et al. |
| 2006/0195522 A1 | 8/2006 | Miyazaki |
| 2006/0197753 A1 | 9/2006 | Hotelling |
| 2006/0197755 A1 | 9/2006 | Bawany |
| 2006/0209050 A1 | 9/2006 | Serban |
| 2006/0238510 A1 | 10/2006 | Panotopoulos et al. |
| 2006/0248597 A1 | 11/2006 | Keneman |
| 2007/0043725 A1 | 2/2007 | Hotelling et al. |
| 2007/0047221 A1 | 3/2007 | Park |
| 2007/0051792 A1 | 3/2007 | Wheeler et al. |
| 2007/0056385 A1 | 3/2007 | Lorenz |
| 2007/0057922 A1 | 3/2007 | Schultz et al. |
| 2007/0062089 A1 | 3/2007 | Homer et al. |
| 2007/0069153 A1 | 3/2007 | Pai-Paranjape et al. |
| 2007/0072474 A1 | 3/2007 | Beasley et al. |
| 2007/0145945 A1 | 6/2007 | McGinley et al. |
| 2007/0152983 A1 | 7/2007 | McKillop et al. |
| 2007/0182663 A1 | 8/2007 | Biech |
| 2007/0182722 A1 | 8/2007 | Hotelling et al. |
| 2007/0200830 A1 | 8/2007 | Yamamoto |
| 2007/0205995 A1 | 9/2007 | Woolley |
| 2007/0220708 A1 | 9/2007 | Lewis |
| 2007/0234420 A1 | 10/2007 | Novotney et al. |
| 2007/0236408 A1 | 10/2007 | Yamaguchi et al. |
| 2007/0236475 A1 | 10/2007 | Wherry |
| 2007/0247338 A1 | 10/2007 | Marchetto |
| 2007/0247432 A1 | 10/2007 | Oakley |
| 2007/0257821 A1 | 11/2007 | Son et al. |
| 2007/0260892 A1 | 11/2007 | Paul et al. |
| 2007/0274094 A1 | 11/2007 | Schultz et al. |
| 2007/0274095 A1 | 11/2007 | Destain |
| 2007/0283179 A1 | 12/2007 | Burnett et al. |
| 2008/0005423 A1 | 1/2008 | Jacobs et al. |
| 2008/0013809 A1 | 1/2008 | Zhu et al. |
| 2008/0018608 A1 | 1/2008 | Serban et al. |
| 2008/0018611 A1 | 1/2008 | Serban et al. |
| 2008/0024459 A1 | 1/2008 | Poupyrev et al. |
| 2008/0042994 A1 | 2/2008 | Gillespie et al. |
| 2008/0094367 A1 | 4/2008 | Van De Ven et al. |
| 2008/0104437 A1 | 5/2008 | Lee |
| 2008/0151478 A1 | 6/2008 | Chern |
| 2008/0158185 A1 | 7/2008 | Westerman |
| 2008/0167832 A1 | 7/2008 | Soss |
| 2008/0180411 A1 | 7/2008 | Solomon et al. |
| 2008/0202251 A1 | 8/2008 | Serban et al. |
| 2008/0202824 A1 | 8/2008 | Philipp et al. |
| 2008/0219025 A1 | 9/2008 | Spitzer et al. |
| 2008/0224659 A1 | 9/2008 | Singh |
| 2008/0228969 A1 | 9/2008 | Cheah et al. |
| 2008/0232061 A1 | 9/2008 | Wang et al. |
| 2008/0238884 A1 | 10/2008 | Harish |
| 2008/0253822 A1 | 10/2008 | Matias |
| 2008/0297878 A1 | 12/2008 | Brown et al. |
| 2008/0303646 A1 | 12/2008 | Elwell et al. |
| 2008/0309636 A1 | 12/2008 | Feng et al. |
| 2008/0316002 A1 | 12/2008 | Brunet et al. |
| 2008/0320190 A1 | 12/2008 | Lydon et al. |
| 2009/0002218 A1 | 1/2009 | Rigazio et al. |
| 2009/0007001 A1 | 1/2009 | Morin et al. |
| 2009/0009476 A1 | 1/2009 | Daley, III |
| 2009/0046416 A1 | 2/2009 | Daley, III |
| 2009/0049979 A1 | 2/2009 | Naik et al. |
| 2009/0065267 A1 | 3/2009 | Sato |
| 2009/0073060 A1 | 3/2009 | Shimasaki et al. |
| 2009/0073957 A1 | 3/2009 | Newland et al. |
| 2009/0079639 A1 | 3/2009 | Hotta et al. |
| 2009/0083562 A1 | 3/2009 | Park et al. |
| 2009/0090568 A1 | 4/2009 | Min |
| 2009/0117955 A1 | 5/2009 | Lo |
| 2009/0127005 A1 | 5/2009 | Zachut et al. |
| 2009/0128374 A1 | 5/2009 | Reynolds et al. |
| 2009/0135142 A1 | 5/2009 | Fu et al. |
| 2009/0140985 A1 | 6/2009 | Liu |
| 2009/0163147 A1 | 6/2009 | Steigerwald et al. |
| 2009/0182901 A1 | 7/2009 | Callaghan et al. |
| 2009/0195497 A1 | 8/2009 | Fitzgerald et al. |
| 2009/0200148 A1 | 8/2009 | Honmatsu et al. |
| 2009/0219250 A1 | 9/2009 | Ure |
| 2009/0231019 A1 | 9/2009 | Yeh |
| 2009/0231275 A1 | 9/2009 | Odgers |
| 2009/0251008 A1 | 10/2009 | Sugaya |
| 2009/0259865 A1 | 10/2009 | Sheynblat et al. |
| 2009/0262492 A1 | 10/2009 | Whitchurch et al. |
| 2009/0265670 A1 | 10/2009 | Kim et al. |
| 2009/0267892 A1 | 10/2009 | Faubert |
| 2009/0284397 A1 | 11/2009 | Lee et al. |
| 2009/0303137 A1 | 12/2009 | Kusaka et al. |
| 2009/0303204 A1 | 12/2009 | Nasiri et al. |
| 2009/0320244 A1 | 12/2009 | Lin |
| 2009/0321490 A1 | 12/2009 | Groene et al. |
| 2010/0001963 A1 | 1/2010 | Doray et al. |
| 2010/0013319 A1 | 1/2010 | Kamiyama et al. |
| 2010/0026656 A1 | 2/2010 | Hotelling et al. |
| 2010/0038821 A1 | 2/2010 | Jenkins et al. |
| 2010/0039764 A1 | 2/2010 | Locker et al. |
| 2010/0045609 A1 | 2/2010 | Do et al. |
| 2010/0045633 A1 | 2/2010 | Gettemy |
| 2010/0051356 A1 | 3/2010 | Stern et al. |
| 2010/0051432 A1 | 3/2010 | Lin et al. |
| 2010/0053087 A1 | 3/2010 | Dai et al. |
| 2010/0053534 A1 | 3/2010 | Hsieh et al. |
| 2010/0075517 A1 | 3/2010 | Ni et al. |
| 2010/0077237 A1 | 3/2010 | Sawyers |
| 2010/0079398 A1 | 4/2010 | Shen et al. |
| 2010/0081377 A1 | 4/2010 | Chatterjee et al. |
| 2010/0085321 A1 | 4/2010 | Pundsack |
| 2010/0097198 A1 | 4/2010 | Suzuki |
| 2010/0102182 A1 | 4/2010 | Lin |
| 2010/0103112 A1 | 4/2010 | Yoo et al. |
| 2010/0103131 A1 | 4/2010 | Segal et al. |
| 2010/0103611 A1 | 4/2010 | Yang et al. |
| 2010/0123686 A1 | 5/2010 | Klinghult et al. |
| 2010/0133398 A1 | 6/2010 | Chiu et al. |
| 2010/0137033 A1 | 6/2010 | Lee |
| 2010/0141588 A1 | 6/2010 | Kimura et al. |
| 2010/0142130 A1 | 6/2010 | Wang et al. |
| 2010/0148642 A1 | 6/2010 | Eromaki et al. |
| 2010/0149111 A1 | 6/2010 | Olien |
| 2010/0149134 A1 | 6/2010 | Westerman et al. |
| 2010/0156798 A1 | 6/2010 | Archer |
| 2010/0161522 A1 | 6/2010 | Tirpak et al. |
| 2010/0162109 A1 | 6/2010 | Chatterjee et al. |
| 2010/0162179 A1 | 6/2010 | Porat |
| 2010/0164857 A1 | 7/2010 | Liu et al. |
| 2010/0171708 A1 | 7/2010 | Chuang |
| 2010/0171891 A1 | 7/2010 | Kaji et al. |
| 2010/0174421 A1 | 7/2010 | Tsai et al. |
| 2010/0180063 A1 | 7/2010 | Ananny et al. |
| 2010/0182263 A1 | 7/2010 | Aunio et al. |
| 2010/0188299 A1 | 7/2010 | Rinehart et al. |
| 2010/0188338 A1 | 7/2010 | Longe |
| 2010/0206614 A1 | 8/2010 | Park et al. |
| 2010/0206644 A1 | 8/2010 | Yeh |
| 2010/0214257 A1 | 8/2010 | Wussler et al. |
| 2010/0222110 A1 | 9/2010 | Kim et al. |
| 2010/0231498 A1 | 9/2010 | Large et al. |
| 2010/0231510 A1 | 9/2010 | Sampsell et al. |
| 2010/0231556 A1 | 9/2010 | Mines et al. |
| 2010/0238075 A1 | 9/2010 | Pourseyed |
| 2010/0238119 A1 | 9/2010 | Dubrovsky et al. |
| 2010/0238138 A1 | 9/2010 | Goertz et al. |
| 2010/0244577 A1 | 9/2010 | Shimokawa |

(56) References Cited

U.S. PATENT DOCUMENTS

| | | |
|---|---|---|
| 2010/0245221 A1 | 9/2010 | Khan |
| 2010/0250988 A1 | 9/2010 | Okuda et al. |
| 2010/0274932 A1 | 10/2010 | Kose |
| 2010/0279768 A1 | 11/2010 | Huang et al. |
| 2010/0289457 A1 | 11/2010 | Onnerud et al. |
| 2010/0289508 A1 | 11/2010 | Joguet et al. |
| 2010/0295812 A1 | 11/2010 | Burns et al. |
| 2010/0302378 A1 | 12/2010 | Marks et al. |
| 2010/0304793 A1 | 12/2010 | Kim |
| 2010/0306538 A1 | 12/2010 | Thomas et al. |
| 2010/0308778 A1 | 12/2010 | Yamazaki et al. |
| 2010/0308844 A1 | 12/2010 | Day et al. |
| 2010/0315348 A1 | 12/2010 | Jellicoe et al. |
| 2010/0315373 A1 | 12/2010 | Steinhauser et al. |
| 2010/0321299 A1 | 12/2010 | Shelley et al. |
| 2010/0321301 A1 | 12/2010 | Casparian et al. |
| 2010/0321330 A1 | 12/2010 | Lim et al. |
| 2010/0321339 A1 | 12/2010 | Kimmel |
| 2010/0325155 A1 | 12/2010 | Skinner et al. |
| 2010/0331059 A1 | 12/2010 | Apgar et al. |
| 2011/0007008 A1 | 1/2011 | Algreatly |
| 2011/0012873 A1 | 1/2011 | Prest et al. |
| 2011/0018556 A1 | 1/2011 | Le et al. |
| 2011/0019123 A1 | 1/2011 | Prest et al. |
| 2011/0031287 A1 | 2/2011 | Le Gette et al. |
| 2011/0036965 A1 | 2/2011 | Zhang et al. |
| 2011/0037379 A1 | 2/2011 | Lecamp et al. |
| 2011/0037721 A1 | 2/2011 | Cranfill et al. |
| 2011/0043454 A1 | 2/2011 | Modarres et al. |
| 2011/0043990 A1 | 2/2011 | Mickey et al. |
| 2011/0050587 A1 | 3/2011 | Natanzon et al. |
| 2011/0050630 A1 | 3/2011 | Ikeda |
| 2011/0055407 A1 | 3/2011 | Lydon et al. |
| 2011/0057899 A1 | 3/2011 | Sleeman et al. |
| 2011/0059771 A1 | 3/2011 | Kondo |
| 2011/0060926 A1 | 3/2011 | Brooks et al. |
| 2011/0069148 A1 | 3/2011 | Jones et al. |
| 2011/0074688 A1 | 3/2011 | Hull et al. |
| 2011/0080347 A1 | 4/2011 | Steeves et al. |
| 2011/0084909 A1 | 4/2011 | Hsieh et al. |
| 2011/0095994 A1 | 4/2011 | Birnbaum |
| 2011/0096513 A1 | 4/2011 | Kim |
| 2011/0102326 A1 | 5/2011 | Casparian et al. |
| 2011/0102356 A1 | 5/2011 | Kemppinen et al. |
| 2011/0115712 A1 | 5/2011 | Han et al. |
| 2011/0115747 A1 | 5/2011 | Powell et al. |
| 2011/0118025 A1 | 5/2011 | Lukas et al. |
| 2011/0128227 A1 | 6/2011 | Theimer |
| 2011/0134032 A1 | 6/2011 | Chiu et al. |
| 2011/0134112 A1 | 6/2011 | Koh et al. |
| 2011/0141052 A1 | 6/2011 | Bernstein et al. |
| 2011/0147398 A1 | 6/2011 | Ahee et al. |
| 2011/0148793 A1 | 6/2011 | Ciesla et al. |
| 2011/0157087 A1 | 6/2011 | Kanehira et al. |
| 2011/0163955 A1 | 7/2011 | Nasiri et al. |
| 2011/0164370 A1 | 7/2011 | McClure et al. |
| 2011/0167181 A1 | 7/2011 | Minoo et al. |
| 2011/0167287 A1 | 7/2011 | Walsh et al. |
| 2011/0167391 A1 | 7/2011 | Momeyer et al. |
| 2011/0167992 A1 | 7/2011 | Eventoff et al. |
| 2011/0179864 A1 | 7/2011 | Raasch et al. |
| 2011/0184646 A1 | 7/2011 | Wong et al. |
| 2011/0193787 A1 | 8/2011 | Morishige et al. |
| 2011/0193938 A1 | 8/2011 | Oderwald et al. |
| 2011/0202878 A1 | 8/2011 | Park et al. |
| 2011/0205372 A1 | 8/2011 | Miramontes |
| 2011/0216266 A1 | 9/2011 | Travis |
| 2011/0222238 A1 | 9/2011 | Staats et al. |
| 2011/0227913 A1 | 9/2011 | Hyndman |
| 2011/0231682 A1 | 9/2011 | Kakish et al. |
| 2011/0234502 A1 | 9/2011 | Yun et al. |
| 2011/0241999 A1 | 10/2011 | Thier |
| 2011/0242138 A1 | 10/2011 | Tribble |
| 2011/0248152 A1 | 10/2011 | Svajda et al. |
| 2011/0248920 A1 | 10/2011 | Larsen |
| 2011/0248930 A1 | 10/2011 | Kwok et al. |
| 2011/0248941 A1* | 10/2011 | Abdo .............. G06F 3/0488 345/173 |
| 2011/0261001 A1 | 10/2011 | Liu |
| 2011/0261021 A1 | 10/2011 | Modarres et al. |
| 2011/0261083 A1 | 10/2011 | Wilson |
| 2011/0267294 A1 | 11/2011 | Kildal |
| 2011/0267300 A1 | 11/2011 | Serban et al. |
| 2011/0267757 A1 | 11/2011 | Probst |
| 2011/0290686 A1 | 12/2011 | Huang |
| 2011/0295697 A1 | 12/2011 | Boston et al. |
| 2011/0297566 A1 | 12/2011 | Gallagher et al. |
| 2011/0304577 A1 | 12/2011 | Brown et al. |
| 2011/0304962 A1 | 12/2011 | Su |
| 2011/0306424 A1 | 12/2011 | Kazama et al. |
| 2011/0316807 A1 | 12/2011 | Corrion |
| 2012/0007821 A1 | 1/2012 | Zaliva |
| 2012/0011462 A1 | 1/2012 | Westerman et al. |
| 2012/0013519 A1 | 1/2012 | Hakansson et al. |
| 2012/0023459 A1 | 1/2012 | Westerman |
| 2012/0024682 A1 | 2/2012 | Huang et al. |
| 2012/0026048 A1 | 2/2012 | Vazquez et al. |
| 2012/0044179 A1 | 2/2012 | Hudson |
| 2012/0047368 A1 | 2/2012 | Chinn et al. |
| 2012/0050975 A1 | 3/2012 | Garelli et al. |
| 2012/0055770 A1 | 3/2012 | Chen |
| 2012/0062245 A1 | 3/2012 | Bao et al. |
| 2012/0068933 A1 | 3/2012 | Larsen |
| 2012/0068957 A1 | 3/2012 | Puskarich et al. |
| 2012/0072167 A1 | 3/2012 | Cretella, Jr. et al. |
| 2012/0075249 A1 | 3/2012 | Hoch |
| 2012/0081316 A1 | 4/2012 | Sirpal et al. |
| 2012/0087078 A1 | 4/2012 | Medica et al. |
| 2012/0092279 A1 | 4/2012 | Martin |
| 2012/0092350 A1 | 4/2012 | Ganapathi et al. |
| 2012/0094257 A1 | 4/2012 | Pillischer et al. |
| 2012/0098751 A1 | 4/2012 | Lin |
| 2012/0099263 A1 | 4/2012 | Lin |
| 2012/0099749 A1 | 4/2012 | Rubin et al. |
| 2012/0106078 A1 | 5/2012 | Probst et al. |
| 2012/0106082 A1 | 5/2012 | Wu et al. |
| 2012/0113579 A1 | 5/2012 | Agata et al. |
| 2012/0115553 A1 | 5/2012 | Mahe et al. |
| 2012/0117409 A1 | 5/2012 | Lee et al. |
| 2012/0127118 A1 | 5/2012 | Nolting et al. |
| 2012/0127646 A1 | 5/2012 | Moscovitch |
| 2012/0140396 A1 | 6/2012 | Zeliff et al. |
| 2012/0145525 A1 | 6/2012 | Ishikawa |
| 2012/0155015 A1 | 6/2012 | Govindasamy et al. |
| 2012/0162693 A1 | 6/2012 | Ito |
| 2012/0175487 A1 | 7/2012 | Goto |
| 2012/0182242 A1 | 7/2012 | Lindahl et al. |
| 2012/0194393 A1 | 8/2012 | Uttermann et al. |
| 2012/0194448 A1 | 8/2012 | Rothkopf |
| 2012/0200532 A1 | 8/2012 | Powell et al. |
| 2012/0200802 A1 | 8/2012 | Large |
| 2012/0206401 A1 | 8/2012 | Lin et al. |
| 2012/0206937 A1 | 8/2012 | Travis et al. |
| 2012/0223866 A1 | 9/2012 | Ayala Vazquez et al. |
| 2012/0224073 A1 | 9/2012 | Miyahara |
| 2012/0235635 A1 | 9/2012 | Sato |
| 2012/0235921 A1 | 9/2012 | Laubach |
| 2012/0235942 A1 | 9/2012 | Shahoian et al. |
| 2012/0242588 A1 | 9/2012 | Myers et al. |
| 2012/0246377 A1 | 9/2012 | Bhesania |
| 2012/0249459 A1 | 10/2012 | Sashida et al. |
| 2012/0256959 A1 | 10/2012 | Ye et al. |
| 2012/0268911 A1 | 10/2012 | Lin |
| 2012/0274811 A1 | 11/2012 | Bakin |
| 2012/0287562 A1 | 11/2012 | Wu et al. |
| 2012/0299866 A1 | 11/2012 | Pao et al. |
| 2012/0300275 A1 | 11/2012 | Vilardell et al. |
| 2012/0304199 A1 | 11/2012 | Homma et al. |
| 2012/0312955 A1 | 12/2012 | Randolph |
| 2012/0328349 A1 | 12/2012 | Isaac et al. |
| 2013/0009892 A1 | 1/2013 | Salmela et al. |
| 2013/0044059 A1 | 2/2013 | Fu |
| 2013/0047747 A1 | 2/2013 | Joung, II |
| 2013/0063364 A1 | 3/2013 | Moore |

(56) References Cited

U.S. PATENT DOCUMENTS

| | | |
|---|---|---|
| 2013/0063873 A1 | 3/2013 | Wodrich et al. |
| 2013/0076646 A1 | 3/2013 | Krah et al. |
| 2013/0088431 A1 | 4/2013 | Ballagas et al. |
| 2013/0088442 A1 | 4/2013 | Lee |
| 2013/0094131 A1 | 4/2013 | O'Donnell et al. |
| 2013/0097534 A1 | 4/2013 | Lewin et al. |
| 2013/0106766 A1 | 5/2013 | Yilmaz et al. |
| 2013/0107144 A1 | 5/2013 | Marhefka et al. |
| 2013/0118933 A1 | 5/2013 | Wang et al. |
| 2013/0141370 A1 | 6/2013 | Wang et al. |
| 2013/0167663 A1 | 7/2013 | Eventoff |
| 2013/0194235 A1 | 8/2013 | Zanone et al. |
| 2013/0201115 A1 | 8/2013 | Heubel |
| 2013/0227836 A1 | 9/2013 | Whitt, III et al. |
| 2013/0228433 A1 | 9/2013 | Shaw |
| 2013/0229273 A1 | 9/2013 | Nodar Cortizo et al. |
| 2013/0229356 A1 | 9/2013 | Marwah et al. |
| 2013/0229386 A1 | 9/2013 | Bathiche |
| 2013/0275058 A1 | 10/2013 | Awad |
| 2013/0278542 A1 | 10/2013 | Stephanou et al. |
| 2013/0278552 A1 | 10/2013 | Kamin-Lyndgaard |
| 2013/0300683 A1 | 11/2013 | Binbaum et al. |
| 2013/0304941 A1 | 11/2013 | Drasnin |
| 2013/0304944 A1 | 11/2013 | Young |
| 2013/0335330 A1 | 12/2013 | Lane |
| 2013/0335902 A1 | 12/2013 | Campbell |
| 2013/0335903 A1 | 12/2013 | Raken |
| 2013/0342464 A1 | 12/2013 | Bathiche et al. |
| 2013/0342465 A1 | 12/2013 | Bathiche |
| 2013/0346636 A1 | 12/2013 | Bathiche |
| 2014/0008203 A1 | 1/2014 | Nathan et al. |
| 2014/0020484 A1 | 1/2014 | Shaw et al. |
| 2014/0022177 A1 | 1/2014 | Shaw |
| 2014/0028624 A1 | 1/2014 | Marsden et al. |
| 2014/0055375 A1 | 2/2014 | Kim et al. |
| 2014/0062933 A1 | 3/2014 | Coulson et al. |
| 2014/0062934 A1 | 3/2014 | Coulson et al. |
| 2014/0083207 A1 | 3/2014 | Eventoff |
| 2014/0085247 A1 | 3/2014 | Leung et al. |
| 2014/0098058 A1 | 4/2014 | Baharav et al. |
| 2014/0139436 A1 | 5/2014 | Ramstein et al. |
| 2014/0139472 A1 | 5/2014 | Takenaka |
| 2014/0197058 A1 | 7/2014 | Huet et al. |
| 2014/0210742 A1 | 7/2014 | Delattre et al. |
| 2014/0221098 A1 | 8/2014 | Boulanger |
| 2014/0230575 A1 | 8/2014 | Picciotto et al. |
| 2014/0232679 A1 | 8/2014 | Whitman et al. |
| 2014/0253305 A1 | 9/2014 | Rosenberg et al. |
| 2014/0306914 A1 | 10/2014 | Kagayama |
| 2015/0084865 A1 | 3/2015 | Shaw et al. |
| 2015/0084909 A1 | 3/2015 | Worfolk et al. |
| 2015/0160778 A1 | 6/2015 | Kim et al. |
| 2015/0185842 A1 | 7/2015 | Picciotto et al. |
| 2015/0193034 A1 | 7/2015 | Jeong et al. |
| 2015/0227207 A1 | 8/2015 | Winter et al. |
| 2015/0241929 A1 | 8/2015 | Raken et al. |
| 2015/0242012 A1 | 8/2015 | Petcavich et al. |
| 2015/0301642 A1 | 10/2015 | Hanauer et al. |
| 2016/0070398 A1 | 3/2016 | Worfolk |
| 2016/0170935 A1 | 6/2016 | Drasnin |
| 2016/0195955 A1 | 7/2016 | Picciotto et al. |
| 2016/0313832 A1 | 10/2016 | Shaw et al. |
| 2016/0357296 A1 | 12/2016 | Picciotto et al. |
| 2017/0023418 A1 | 1/2017 | Shaw et al. |
| 2017/0102770 A1 | 4/2017 | Winter et al. |

FOREIGN PATENT DOCUMENTS

| | | |
|---|---|---|
| CN | 102356624 | 2/2012 |
| EP | 1223722 | 7/2002 |
| EP | 1591891 | 11/2005 |
| EP | 2353978 | 8/2011 |
| EP | 2381340 | 10/2011 |
| EP | 2584432 | 4/2013 |
| GB | 2178570 | 2/1987 |
| JP | 10326124 | 12/1998 |
| JP | 1173239 | 3/1999 |
| JP | 11345041 | 12/1999 |
| KR | 1020110087178 | 8/2011 |
| NL | 1038411 | 5/2012 |
| WO | WO-2010011983 | 1/2010 |
| WO | WO-2012036717 | 3/2012 |
| WO | WO-2012173305 | 12/2012 |
| WO | WO-2013169299 | 11/2013 |
| WO | WO-2014098946 | 6/2014 |

OTHER PUBLICATIONS

"ACPI Docking for Windows Operating Systems", Retrieved from: <http://www.scritube.com/limba/engleza/software/ACPI-Docking-for-Windows-Opera331824193.php> on Jul. 6, 2012, 10 pages.

"Advanced Configuration and Power Management Specification", Intel Corporation, Microsoft Corporation, Toshiba Corp. Revision 1, Dec. 22, 1996, 364 pages.

"Advisory Action", U.S. Appl. No. 13/975,087, dated Nov. 16, 2015, 3 pages.

"Capacitive Touch Sensors—Application Fields, Technology Overview and Implementation Example", Fujitsu Microelectronics Europe GmbH; retrieved from http://www.fujitsu.com/downloads/MICRO/fme/articles/fujitsu-whitepaper-capacitive-touch-sensors.pdf on Jul. 20, 2011, Jan. 12, 2010, 12 pages.

"Cholesteric Liquid Crystal", Retrieved from: <http://en.wikipedia.org/wiki/Cholesteric_liquid_crystal> on Aug. 6, 2012, Jun. 10, 2012, 2 pages.

"Cirago Slim Case®—Protective case with built-in kickstand for your iPhone 5®", Retrieved from <http://cirago.com/wordpress/wp-content/uploads/2012/10/ipc1500brochure1.pdf> on Jan. 29, 2013, Jan. 2013, 1 page.

"Corrected Notice of Allowance", U.S. Appl. No. 13/470,633, dated Apr. 9, 2013, 2 pages.

"Corrected Notice of Allowance", U.S. Appl. No. 13/470,633, dated Jul. 2, 2013, 2 pages.

"Corrected Notice of Allowance", U.S. Appl. No. 13/527,263, dated Jan. 4, 2016, 2 pages.

"Corrected Notice of Allowance", U.S. Appl. No. 13/527,263, dated Jan. 11, 2016, 2 pages.

"Corrected Notice of Allowance", U.S. Appl. No. 13/527,263, dated Mar. 7, 2016, 2 pages.

"Corrected Notice of Allowance", U.S. Appl. No. 13/527,263, dated Apr. 12, 2016, 2 pages.

"Corrected Notice of Allowance", U.S. Appl. No. 13/527,263, dated Apr. 25, 2016, 2 pages.

"Corrected Notice of Allowance", U.S. Appl. No. 13/603,918, dated May 8, 2015, 2 pages.

"Corrected Notice of Allowance", U.S. Appl. No. 13/645,405, dated Jul. 7, 2015, 2 pages.

"Corrected Notice of Allowance", U.S. Appl. No. 14/033,290, dated Jul. 13, 2016, 2 pages.

"Corrected Notice of Allowance", U.S. Appl. No. 14/033,508, dated Jun. 16, 2016, 2 pages.

"Corrected Notice of Allowance", U.S. Appl. No. 14/033,508, dated Sep. 9, 2016, 2 pages.

"Corrected Notice of Allowance", U.S. Appl. No. 14/033,510, dated May 5, 2017, 2 pages.

"Corrected Notice of Allowance", U.S. Appl. No. 14/698,318, dated Jun. 9, 2016, 2 pages.

"Developing Next-Generation Human Interfaces using Capacitive and Infrared Proximity Sensing", Silicon Laboratories, Inc., Available at <http://www.silabs.com/pages/DownloadDoc.aspx?FILEURL=support%20documents/technicaldocs/capacitive%20and%20proximity%20sensing_wp.pdf&src=SearchResults>, Aug. 30, 2010, pp. 1-10.

"Directional Backlighting for Display Panels", U.S. Appl. No. 13/021,448, filed Feb. 4, 2011, 38 pages.

"DR2PA", retrieved from <http://www.architainment.co.uk/wp-content/uploads/2012/08/DR2PA-AU-US-size-Data-Sheet-Rev-H_LOGO.pdf> on Sep. 17, 2012, Jan. 2012, 4 pages.

(56) References Cited

OTHER PUBLICATIONS

"Ex Parte Quayle Action", U.S. Appl. No. 13/599,763, Nov. 14, 2014, 6 pages.
"Examiner's Answer to Appeal Brief", U.S. Appl. No. 13/974,994, dated May 18, 2016, 40 pages.
"Examiner's Answer to Appeal Brief", U.S. Appl. No. 14/697,501, dated Apr. 7, 2017, 12 pages.
"Final Office Action", U.S. Appl. No. 13/471,001, dated Jul. 25, 2013, 20 pages.
"Final Office Action", U.S. Appl. No. 13/527,263, dated Jan. 27, 2015, 7 pages.
"Final Office Action", U.S. Appl. No. 13/603,918, dated Mar. 21, 2014, 14 pages.
"Final Office Action", U.S. Appl. No. 13/647,479, dated Sep. 17, 2015, 11 pages.
"Final Office Action", U.S. Appl. No. 13/647,479, dated Dec. 12, 2014, 12 pages.
"Final Office Action", U.S. Appl. No. 13/651,195, dated Apr. 18, 2013, 13 pages.
"Final Office Action", U.S. Appl. No. 13/651,232, dated May 21, 2013, 21 pages.
"Final Office Action", U.S. Appl. No. 13/651,287, dated May 3, 2013, 16 pages.
"Final Office Action", U.S. Appl. No. 13/651,976, dated Jul. 25, 2013, 21 pages.
"Final Office Action", U.S. Appl. No. 13/653,321, dated Aug. 2, 2013, 17 pages.
"Final Office Action", U.S. Appl. No. 13/655,065, dated Apr. 2, 2015, 23 pages.
"Final Office Action", U.S. Appl. No. 13/655,065, dated Aug. 8, 2014, 20 pages.
"Final Office Action", U.S. Appl. No. 13/655,065, dated Nov. 17, 2015, 25 pages.
"Final Office Action", U.S. Appl. No. 13/759,875, dated Mar. 27, 2015, 18 pages.
"Final Office Action", U.S. Appl. No. 13/769,356, dated Apr. 10, 2015, 9 pages.
"Final Office Action", U.S. Appl. No. 13/974,749, dated Mar. 23, 2016, 22 pages.
"Final Office Action", U.S. Appl. No. 13/974,749, dated May 21, 2015, 19 pages.
"Final Office Action", U.S. Appl. No. 13/974,749, dated Sep. 5, 2014, 18 pages.
"Final Office Action", U.S. Appl. No. 13/974,994, dated Jun. 10, 2015, 28 pages.
"Final Office Action", U.S. Appl. No. 13/974,994, dated Oct. 6, 2014, 26 pages.
"Final Office Action", U.S. Appl. No. 13/975,087, dated Aug. 7, 2015, 16 pages.
"Final Office Action", U.S. Appl. No. 13/975,087, dated Sep. 10, 2014, 19 pages.
"Final Office Action", U.S. Appl. No. 13/975,087, dated Nov. 4, 2016, 23 pages.
"Final Office Action", U.S. Appl. No. 14/033,510, dated Feb. 8, 2016, 27 pages.
"Final Office Action", U.S. Appl. No. 14/033,510, dated Jun. 5, 2015, 24 pages.
"Final Office Action", U.S. Appl. No. 14/033,510, dated Aug. 21, 2014, 18 pages.
"Final Office Action", U.S. Appl. No. 14/033,510, dated Sep. 22, 2016, 21 pages.
"Final Office Action", U.S. Appl. No. 14/591,704, dated Nov. 25, 2016, 33 pages.
"Final Office Action", U.S. Appl. No. 14/697,501, dated Apr. 18, 2016, 14 pages.
"First One Handed Fabric Keyboard with Bluetooth Wireless Technology", Retrieved from: <http://press.xtvworld.com/article3817.html> on May 8, 2012, Jan. 6, 2005, 2 pages.
"Force and Position Sensing Resistors: An Emerging Technology", Interlink Electronics, Available at <http://staff.science.uva.nl/~vlaander/docu/FSR/An_Exploring_Technology.pdf>, Feb. 1990, pp. 1-6.
"Foreign Notice of Allowance", CN Application No. 201310316114.2, dated Aug. 2, 2016, 4 pages.
"Foreign Office Action", CN Application No. 201310316114.2, dated Apr. 18, 2016, 11 pages.
"Foreign Office Action", CN Application No. 201310316114.2, dated Sep. 29, 2015, 13 pages.
"Frogpad Introduces Weareable Fabric Keyboard with Bluetooth Technology", Retrieved from: <http://www.geekzone.co.nz/content.asp?contentid=3898> on May 7, 2012, Jan. 7, 2005, 3 pages.
"How to Use the iPad's Onscreen Keyboard", Retrieved from <http://www.dummies.com/how-to/content/how-to-use-the-ipads-onscreen-keyboard.html> on Aug. 28, 2012, 2012, 3 pages.
"iControlPad 2—The open source controller", Retrieved from <http://www.kickstarter.com/projects/1703567677/icontrolpad-2-the-open-source-controller> on Nov. 20, 2012, 2012, 15 pages.
"i-Interactor electronic pen", Retrieved from: <http://www.alibaba.com/product-gs/331004878/i_Interactor_electronic_pen.html> on Jun. 19, 2012, 2012, 5 pages.
"Incipio LG G-Slate Premium Kickstand Case—Black Nylon", Retrieved from: <http://www.amazon.com/Incipio-G-Slate-Premium-Kickstand-Case/dp/B004ZKP916> on May 8, 2012, 2012, 4 pages.
"International Preliminary Report on Patentability", Application No. PCT/US2015/067754, dated Jan. 10, 2017, 10 pages.
"International Preliminary Report on Patentability", Application No. PCT/US2016/031699, dated Feb. 22, 2017, 6 pages.
"International Preliminary Report on Patentability", Application No. PCT/US2014/056185, dated Dec. 23, 2015, 7 pages.
"International Search Report and Written Opinion", Application No. PCT/US2014/068687, dated Mar. 18, 2015, 10 pages.
"International Search Report and Written Opinion", Application No. PCT/US2014/016151, dated May 16, 2014, 10 pages.
"International Search Report and Written Opinion", Application No. PCT/US2014/056185, dated Dec. 4, 2014, 10 pages.
"International Search Report and Written Opinion", Application No. PCT/US2013/028948, datedc Jun. 21, 2013, 11 pages.
"International Search Report and Written Opinion", Application No. PCT/US2013/029461, dated Jun. 21, 2013, 11 pages.
"International Search Report and Written Opinion", Application No. PCT/US2013/040968, dated Sep. 5, 2013, 11 pages.
"International Search Report and Written Opinion", Application No. PCT/US2013/044871, dated Aug. 14, 2013, 12 pages.
"International Search Report and Written Opinion", Application No. PCT/US2015/067754, dated Apr. 7, 2016, 13 pages.
"International Search Report and Written Opinion", Application No. PCT/US2014/014522, dated Jun. 6, 2014, 13 pages.
"International Search Report and Written Opinion", Application No. PCT/US2016/025966, dated Jun. 15, 2016, 15 pages.
"International Search Report and Written Opinion", Application No. PCT/US2013/045283, dated Mar. 12, 2014, 19 pages.
"International Search Report and Written Opinion", Application No. PCT/US2016/031699, dated Nov. 11, 2016, 23 pages.
"International Search Report and Written Opinion", Application No. PCT/US2013/044873, dated Nov. 22, 2013, 9 pages.
"International Search Report and Written Opinion", Application No. PCT/US2013/045049, dated Sep. 16, 2013, 9 pages.
"Membrane Keyboards & Membrane Keypads", Retrieved from: <http://www.pannam.com/> on May 9, 2012, Mar. 4, 2009, 2 pages.
"Microsoft Tablet PC", Retrieved from <http://web.archive.org/web/20120622064335/https://en.wikipedia.org/wiki/Microsoft_Tablet_PC> on Jun. 4, 2014, Jun. 21, 2012, 9 pages.
"Motion Sensors", Android Developers—retrieved from <http://developer.android.com/guide/topics/sensors/sensors_motion.html> on May 25, 2012, 2012, 7 pages.
"MPC Fly Music Production Controller", AKAI Professional, Retrieved from: <http://www.akaiprompc.com/mpc-fly> on Jul. 9, 2012, 4 pages.
"NI Releases New Maschine & Maschine Mikro", Retrieved from <http://www.djbooth.net/index/dj-equipment/entry/ni-releases-new-maschine-mikro/> on Sep. 17, 2012, 19 pages.

(56) References Cited

OTHER PUBLICATIONS

"Non-Final Office Action", U.S. Appl. No. 13/021,448, dated Dec. 13, 2012, 9 pages.
"Non-Final Office Action", U.S. Appl. No. 13/471,001, dated Feb. 19, 2013, 15 pages.
"Non-Final Office Action", U.S. Appl. No. 13/471,139, dated Mar. 21, 2013, 12 pages.
"Non-Final Office Action", U.S. Appl. No. 13/471,202, dated Feb. 11, 2013, 10 pages.
"Non-Final Office Action", U.S. Appl. No. 13/471,336, dated Jan. 18, 2013, 14 pages.
"Non-Final Office Action", U.S. Appl. No. 13/527,263, dated Apr. 3, 2014, 6 pages.
"Non-Final Office Action", U.S. Appl. No. 13/527,263, dated Jul. 19, 2013, 5 pages.
"Non-Final Office Action", U.S. Appl. No. 13/563,435, dated Jun. 14, 2013, 6 pages.
"Non-Final Office Action", U.S. Appl. No. 13/564,520, dated Jun. 19, 2013, 8 pages.
"Non-Final Office Action", U.S. Appl. No. 13/565,124, dated Jun. 17, 2013, 5 pages.
"Non-Final Office Action", U.S. Appl. No. 13/599,763, dated May 28, 2014, 6 pages.
"Non-Final Office Action", U.S. Appl. No. 13/603,918, dated Sep. 2, 2014, 13 pages.
"Non-Final Office Action", U.S Appl. No. 13/603,918, dated Dec. 19, 2013, 12 pages.
"Non-Final Office Action", U.S. Appl. No. 13/645,405, dated Jan. 31, 2014, 6 pages.
"Non-Final Office Action", U.S. Appl. No. 13/645,405, dated Aug. 11, 2014, 5 pages.
"Non-Final Office Action", U.S. Appl. No. 13/647,479, dated Apr. 28, 2015, 11 pages.
"Non-Final Office Action", U.S. Appl. No. 13/647,479, dated Jul. 3, 2014, 10 pages.
"Non-Final Office Action", U.S. Appl. No. 13/651,195, dated Jan. 2, 2013, 14 pages.
"Non-Final Office Action", U.S. Appl. No. 13/651,232, dated Jan. 17, 2013, 15 pages.
"Non-Final Office Action", U.S. Appl. No. 13/651,272, dated Feb. 12, 2013, 10 pages.
"Non-Final Office Action", U.S. Appl. No. 13/651,287, dated Jan. 29, 2013, 13 pages.
"Non-Final Office Action", U.S. Appl. No. 13/651,304, dated Mar. 22, 2013, 9 pages.
"Non-Final Office Action", U.S. Appl. No. 13/651,327, dated Mar. 22, 2013, 6 pages.
"Non-Final Office Action", U.S. Appl. No. 13/651,726, dated Apr. 15, 2013, 6 pages.
"Non-Final Office Action", U.S. Appl. No. 13/651,871, dated Mar. 18, 2013, 14 pages.
"Non-Final Office Action", U.S. Appl. No. 13/651,871, dated Jul. 1, 2013, 5 pages.
"Non-Final Office Action", U.S. Appl. No. 13/651,976, dated Feb. 22, 2013, 16 pages.
"Non-Final Office Action", U.S. Appl. No. 13/653,321, dated Feb. 1, 2013, 13 pages.
"Non-Final Office Action", U.S. Appl. No. 13/653,682, dated Feb. 7, 2013, 11 pages.
"Non-Final Office Action", U.S. Appl. No. 13/653,682, dated Jun. 3, 2013, 14 pages.
"Non-Final Office Action", U.S. Appl. No. 13/655,065, dated Apr. 24, 2014, 16 pages.
"Non-Final Office Action", U.S. Appl. No. 13/655,065, dated Aug. 19, 2015, 18 pages.
"Non-Final Office Action", U.S. Appl. No. 13/655,065, dated Dec. 19, 2014, 24 pages.
"Non-Final Office Action", U.S. Appl. No. 13/656,055, dated Apr. 23, 2013, 11 pages.
"Non-Final Office Action", U.S. Appl. No. 13/656,520, dated Feb. 1, 2013, 15 pages.
"Non-Final Office Action", U.S. Appl. No. 13/656,520, dated Jun. 5, 2013, 8 pages.
"Non-Final Office Action", U.S. Appl. No. 13/759,875, dated Aug. 1, 2014, 16 pages.
"Non-Final Office Action", U.S. Appl. No. 13/769,356, dated Nov. 20, 2014, 16 pages.
"Non-Final Office Action", U.S. Appl. No. 13/974,749, dated Jan. 20, 2017, 23 pages.
"Non-Final Office Action", U.S. Appl. No. 13/974,749, dated Feb. 12, 2015, 15 pages.
"Non-Final Office Action", U.S. Appl. No. 13/974,749, dated May 8, 2014, 16 pages.
"Non-Final Office Action", U.S. Appl. No. 13/974,749, dated Dec. 3, 2015, 20 pages.
"Non-Final Office Action", U.S. Appl. No. 13/974,994, dated Jan. 23, 2015, 26 pages.
"Non-Final Office Action", U.S. Appl. No. 13/974,994, dated Jun. 4, 2014, 24 pages.
"Non-Final Office Action", U.S. Appl. No. 13/975,087, dated Feb. 27, 2015, 20 pages.
"Non-Final Office Action", U.S. Appl. No. 13/975,087, dated May 8, 2014, 18 pages.
"Non-Final Office Action", U.S. Appl. No. 13/975,087, dated May 10, 2016, 18 pages.
"Non-Final Office Action", U.S. Appl. No. 14/033,290, dated Dec. 3, 2015, 7 pages.
"Non-Final Office Action", U.S. Appl. No. 14/033,508, dated Dec. 3, 2015, 14 pages.
"Non-Final Office Action", U.S. Appl. No. 14/033,510, dated Feb. 12, 2015, 17 pages.
"Non-Final Office Action", U.S. Appl. No. 14/033,510, dated Jun. 5, 2014, 16 pages.
"Non-Final Office Action", U.S. Appl. No. 14/033,510, dated Oct. 7, 2015, 23 pages.
"Non-Final Office Action", U.S. Appl. No. 14/144,876, dated Jun. 10, 2015, 23 pages.
"Non-Final Office Action", U.S. Appl. No. 14/591,704, dated Mar. 10, 2017, 26 pages.
"Non-Final Office Action", U.S. Appl. No. 14/591,704, dated Jun. 7, 2016, 32 pages.
"Non-Final Office Action", U.S. Appl. No. 14/697,501, dated Sep. 29, 2015, 11 pages.
"Non-Final Office Action", U.S. Appl. No. 14/729,793, dated Mar. 31, 2017, 14 pages.
"Non-Final Office Action", U.S. Appl. No. 15/050,072, dated Sep. 23, 2016, 5 pages.
"Non-Final Office Action", U.S. Appl. No. 15/203,636, dated Apr. 13, 2017, 7 pages.
"Non-Final Office Action", U.S. Appl. No. 15/283,913, dated Feb. 10, 2017, 20 pages.
"Notice of Allowance", U.S. Appl. No. 13/470,633, dated Mar. 22, 2013, 7 pages.
"Notice of Allowance", U.S. Appl. No. 13/471,202, dated May 28, 2013, 7 pages.
"Notice of Allowance", U.S. Appl. No. 13/527,263, dated Dec. 9, 2015, 6 pages.
"Notice of Allowance", U.S. Appl. No. 13/599,763, dated Feb. 18, 2015, 4 pages.
"Notice of Allowance", U.S. Appl. No. 13/603,918, dated Jan. 22, 2015, 8 pages.
"Notice of Allowance", U.S. Appl. No. 13/645,405, dated Mar. 26, 2015, 6 pages.
"Notice of Allowance", U.S. Appl. No. 13/647,479, dated Jan. 14, 2016, 8 pages.
"Notice of Allowance", U.S. Appl. No. 13/651,195, dated Jul. 8, 2013, 9 pages.
"Notice of Allowance", U.S. Appl. No. 13/651,272, dated May 2, 2013, 7 pages.
"Notice of Allowance", U.S. Appl. No. 13/651,304, dated Jul. 1, 2013, 5 pages.

(56) References Cited

OTHER PUBLICATIONS

"Notice of Allowance", U.S. Appl. No. 13/651,327, dated Jun. 11, 2013, 7 pages.
"Notice of Allowance", U.S. Appl. No. 13/651,726, dated May 31, 2013, 5 pages.
"Notice of Allowance", U.S. Appl. No. 13/759,875, dated Jul. 31, 2015, 9 pages.
"Notice of Allowance", U.S. Appl. No. 14/033,290, dated Mar. 30, 2016, 5 pages.
"Notice of Allowance", U.S. Appl. No. 14/033,508, dated May 6, 2016, 9 pages.
"Notice of Allowance", U.S. Appl. No. 14/033,510, dated Feb. 15, 2017, 10 pages.
"Notice of Allowance", U.S. Appl. No. 14/698,318, dated May 6, 2016, 13 pages.
"On-Screen Keyboard for Windows 7, Vista, XP with Touchscreen", Retrieved from <www.comfort-software.com/on-screen-keyboard.html> on Aug. 28, 2012, Feb. 2, 2011, 3 pages.
"Optical Sensors in Smart Mobile Devices", ON Semiconductor, TND415/D, Available at <http://www.onsemi.jp/pub_link/Collateral/TND415-D.PDF>, Nov. 2010, pp. 1-13.
"Optics for Displays: Waveguide-based Wedge Creates Collimated Display Backlight", OptoIQ, retrieved from <http://www.optoiq.com/index/photonics-technologies-applications/lfw-display/lfw-article-display.articles.laser-focus-world.volume-46.issue-1.world-news-optics-for_displays.html> on Nov. 2, 2010, Jan. 1, 2010, 3 pages.
"Position Sensors", Android Developers—retrieved from <http://developer.android.com/guide/topics/sensors/sensors_position.html> on May 25, 2012, 5 pages.
"PTAB Decision", U.S. Appl. No. 13/974,994, dated May 16, 2017, 16 pages.
"Reflex LCD Writing Tablets", retrieved from <http://www.kentdisplays.com/products/lcdwritingtablets.html> on Jun. 27, 2012, 3 pages.
"Restriction Requirement", U.S. Appl. No. 13/603,918, dated Nov. 27, 2013, 8 pages.
"Restriction Requirement", U.S. Appl. No. 13/471,139, dated Jan. 17, 2013, 7 pages.
"Restriction Requirement", U.S. Appl. No. 13/651,304, dated Jan. 18, 2013, 7 pages.
"Restriction Requirement", U.S. Appl. No. 13/651,726, dated Feb. 22, 2013, 6 pages.
"Restriction Requirement", U.S. Appl. No. 13/651,871, dated Feb. 7, 2013, 6 pages.
"Restriction Requirement", U.S. Appl. No. 13/715,229, dated Aug. 13, 2013, 7 pages.
"Second Written Opinion", Application No. PCT/US2014/056185, dated Sep. 15, 2015, 5 pages.
"Second Written Opinion", Application No. PCT/US2015/067754, dated Nov. 25, 2016, 8 pages.
"Second Written Opinion", Application No. PCT/US2016/025966, dated Mar. 14, 2017, 7 pages.
"Smart Board™ Interactive Display Frame Pencil Pack", Available at <http://downloads01.smarttech.com/media/sitecore/en/support/product/sbfpd/400series(interactivedisplayframes)/guides/smartboardinteractivedisplayframepencilpackv12mar09.pdf>, 2009, 2 pages.
"Snugg iPad 3 Keyboard Case—Cover Ultra Slim Bluetooth Keyboard Case for the iPad 3 & iPad 2", Retrieved from <https://web.archive.org/web/20120810202056/http://www.amazon.com/Snugg-iPad-Keybaoard-Case-Bluetooth/dp/B008CCHXJE> on Jan. 23, 2015, Aug. 10, 2012, 4 pages.
"SolRxTM E-Series Multidirectional Phototherapy ExpandableTM 2-Bulb Full Body Panel System", Retrieved from: < http://www.solarcsystems.com/us_multidirectional_uv_light_therapy_1_intro.html > on Jul. 25, 2012, 2011, 4 pages.
"Supplemental Notice of Allowance", U.S. Appl. No. 13/603,918, dated Apr. 20, 2015, 8 pages.

"Supplemental Notice of Allowance", U.S. Appl. No. 14/698,318, dated Aug. 15, 2016, 2 pages.
"Tactile Feedback Solutions Using Piezoelectric Actuators", Available at: http://www.eetimes.com/document.asp?doc_id=1278418, Nov. 17, 2010, 6 pages.
"The Microsoft Surface Tablets Comes With Impressive Design and Specs", Retrieved from <http://microsofttabletreview.com/the-microsoft-surface-tablets-comes-with-impressive-design-and-specs> on Jan. 30, 2013, Jun. 2012, 2 pages.
"Tilt Shift Lenses: Perspective Control", retrieved from http://www.cambridgeincolour.com/tutorials/tilt-shift-lenses1.htm, Mar. 28, 2008, 11 Pages.
"Virtualization Getting Started Guide", Red Hat Enterprise Linux 6, Edition 0.2—retrieved from <http://docs.redhat.com/docs/en-US/Red_Hat_Enterprise_Linux/6/html-single/Virtualization_Getting_Started_Guide/index.html> on Jun. 13, 2012, 24 pages.
"Visus Photonics—Visionary Technologies New Generation of Production Ready Keyboard-Keypad Illumination Systems", Available at: <http://www.visusphotonics.com/pdf/appl_keypad_keyboard_backlights.pdf>, May 2006, pp. 1-22.
"What is Active Alignment?", http://www.kasalis.com/active_alignment.html, retrieved on Nov. 22, 2012, Nov. 22, 2012, 2 Pages.
"Write & Learn Spellboard Advanced", Available at <http://somemanuals.com/VTECH,WRITE%2526LEARN--SPELLBOARD--ADV--71000,JIDFHE.PDF>, 2006 22 pages.
"Writer 1 for iPad 1 keyboard + Case (Aluminum Bluetooth Keyboard, Quick Eject and Easy Angle Function!)", Retrieved from <https://web.archive.org/web/20120817053825/http://www.amazon.com/keyboard-Aluminum-Bluetooth-Keyboard-Function/dp/B004OQLSLG> on Jan. 23, 2015, Aug. 17, 2012, 5 pages.
Akamatsu,"Movement Characteristics Using a Mouse with Tactile and Force Feedback", In Proceedings of International Journal of Human-Computer Studies 45, No. 4, Oct. 1996, 11 pages.
Bathiche,"Input Device with Interchangeable Surface", U.S. Appl. No. 13/974,749, filed Aug. 23, 2013, 51 pages.
Block,"DeviceOrientation Event Specification", W3C, Editor's Draft, retrieved from <https://developer.palm.com/content/api/dev-guide/pdk/accessing-device-sensors.html> on May 25, 2012, Jul. 12, 2011, 14 pages.
Brown,"Microsoft Shows Off Pressure-Sensitive Keyboard", retrieved from <http://news.cnet.com/8301-17938_105-10304792-1.html> on May 7, 2012, Aug. 6, 2009, 2 pages.
Butler,"SideSight: Multi-"touch" Interaction around Small Devices", In the proceedings of the 21st annual ACM symposium on User interface software and technology., retrieved from <http://research.microsoft.com/pubs/132534/sidesight_crv3.pdf> on May 29, 2012, Oct. 19, 2008, 4 pages.
Chu,"Design and Analysis of a Piezoelectric Material Based Touch Screen With Additional Pressure and Its Acceleration Measurement Functions", In Proceedings of Smart Materials and Structures, vol. 22, Issue 12, Nov. 1, 2013, 2 pages.
Crider,"Sony Slate Concept Tablet "Grows" a Kickstand", Retrieved from: <http://androidcommunity.com/sony-slate-concept-tablet-grows-a-kickstand-20120116/> on May 4, 2012, Jan. 16, 2012, 9 pages.
Das,"Study of Heat Transfer through Multilayer Clothing Assemblies: A Theoretical Prediction", Retrieved from <http://www.autexrj.com/cms/zalaczone_pliki/5_013_11.pdf>, Jun. 2011, 7 pages.
Dietz,"A Practical Pressure Sensitive Computer Keyboard", In Proceedings of UIST 2009, Oct. 2009, 4 pages.
Gaver,"A Virtual Window on Media Space", retrieved from <http://www.gold.ac.uk/media/15gaver-smets-overbeeke.MediaSpaceWindow.chi95.pdf> on Jun. 1, 2012, retrieved from <http://www.gold.ac.uk/media/15gaver-smets-overbeeke.MediaSpaceWindow.chi95.pdf> on Jun. 1, 2012, May 7, 1995, 9 pages.
Glatt,"Channel and Key Pressure (Aftertouch).", Retrieved from: <http://home.roadrunner.com/~jgglatt/tutr/touch.htm> on Jun. 11, 2012, 2012, 2 pages.
Gong,"PrintSense: A Versatile Sensing Technique to Support Multimodal Flexible Surface Interaction", In Proceedings of the SIGCHI Conference on Human Factors in Computing Systems; retrieved from:

(56) References Cited

OTHER PUBLICATIONS http://dl.acm.org/citation.cfm?id=2556288.2557173&coll=DL&dl=ACM&CFID=571580473&CFTOKEN=89752233 on Sep. 19, 2014, Apr. 26, 2014, 4 pages.
Hanlon,"ElekTex Smart Fabric Keyboard Goes Wireless", Retrieved from: <http://www.gizmag.com/go/5048/> on May 7, 2012, Jan. 15, 2006, 5 pages.
Harada,"VoiceDraw: A Hands-Free Voice-Driven Drawing Application for People With Motor Impairments", In Proceedings of Ninth International ACM SIGACCESS Conference on Computers and Accessibility, retrieved from <http://citeseerx.ist.psu.edu/viewdoc/download?doi=10.1.1.113.7211&rep=rep1&type=pdf> on Jun. 1, 2012, Oct. 15, 2007, 8 pages.
Hinckley,"Touch-Sensing Input Devices", In Proceedings of ACM SIGCHI 1999, May 15, 1999, 8 pages.
Hughes,"Apple's haptic touch feedback concept uses actuators, senses force on iPhone, iPad", Retrieved from: http://appleinsider.com/articles/12/03/22/apples_haptic_touch_feedback_concept_uses_actuators_senses_force_on_iphone_ipad, Mar. 22, 2012, 5 pages.
Iwase,"Multistep Sequential Batch Assembly of Three-Dimensional Ferromagnetic Microstructures with Elastic Hinges", Retrieved at <<http://ieeexplore.ieee.org/stamp/stamp.jsp?tp=&arnumber=1549861>> Proceedings: Journal of Microelectromechanical Systems, Dec. 2005, 7 pages.
Kaufmann,"Hand Posture Recognition Using Real-time Artificial Evolution", EvoApplications'09, retrieved from <http://evelyne.lutton.free.fr/Papers/KaufmannEvolASP2010.pdf> on Jan. 5, 2012, Apr. 3, 2010, 10 pages.
Kaur,"Vincent Liew's redesigned laptop satisfies ergonomic needs", Retrieved from: <http://www.designbuzz.com/entry/vincent-liew-s-redesigned-laptop-satisfies-ergonomic-needs/> on Jul. 27, 2012, Jun. 21, 2010, 4 pages.
Khuntontong,"Fabrication of Molded Interconnection Devices by Ultrasonic Hot Embossing on Thin Polymer Films", IEEE Transactions on Electronics Packaging Manufacturing, vol. 32, No. 3, Jul. 2009, pp. 152-156.
Kyung,"TAXEL: Initial Progress Toward Self-Morphing Visio-Haptic Interface", Proceedings: In IEEE World Haptics Conference, Jun. 21, 2011, 6 pages.
Lane,"Media Processing Input Device", U.S. Appl. No. 13/655,065, filed Oct. 18, 2012, 43 pages.
Li,"Characteristic Mode Based Tradeoff Analysis of Antenna-Chassis Interactions for Multiple Antenna Terminals", In IEEE Transactions on Antennas and Propagation, Retrieved from <http://ieeexplore.ieee.org/stamp/stamp.jsp?tp=&arnumber=6060882>, Feb. 2012, 13 pages.
Linderholm,"Logitech Shows Cloth Keyboard for PDAs", Retrieved from: <http://www.pcworld.com/article/89084/logitech_shows_cloth_keyboard_for_pdas.html> on May 7, 2012, Mar. 15, 2002, 5 pages.
Mackenzie,"The Tactile Touchpad", In Proceedings of the ACM CHI Human Factors in Computing Systems Conference Available at: <http://citeseerx.ist.psu.edu/viewdoc/download?doi=10.1.1.150.4780&rep=rep1&type=pdf>, Mar. 22, 1997, 2 pages.
Manresa-Yee,"Experiences Using a Hands-Free Interface", In Proceedings of the 10th International ACM SIGACCESS Conference on Computers and Accessibility, retrieved from <http://dmi.uib.es/~cmanresay/Research/%5BMan08%5DAssets08.pdf> on Jun. 1, 2012, Oct. 13, 2008, pp. 261-262.
McLellan,"Eleksen Wireless Fabric Keyboard: a first look", Retrieved from: <http://www.zdnetasia.com/eleksen-wireless-fabric-keyboard-a-first-look-40278954.htm> on May 7, 2012, Jul. 17, 2006, 9 pages.
McPherson,"TouchKeys: Capacitive Multi-Touch Sensing on a Physical Keyboard", In Proceedings of NIME 2012, May 2012, 4 pages.
Miller,"MOGA gaming controller enhances the Android gaming experience", Retrieved from <http://www.zdnet.com/moga-gaming-controller-enhances-the-android-gaming-experience-7000007550/> on Nov. 20, 2012, Nov. 18, 2012, 9 pages.
Nakanishi,"Movable Cameras Enhance Social Telepresence in Media Spaces", In Proceedings of the 27th International Conference on Human Factors in Computing Systems, retrieved from <http://smg.ams.eng.osaka-u.ac.jp/~nakanishi/hnp_2009_chi.pdf> on Jun. 1, 2012, Apr. 6, 2009, 10 pages.
Odegard,"My iPad MagPad concept", Retrieved from <http://www.pocketables.com/2011/02/my-ipad-magpad-concept.html> on Oct. 1, 2015, Feb. 26, 2011, 8 pages.
Picciotto,"Piezo-Actuated Virtual Buttons for Touch Surfaces", U.S. Appl. No. 13/769,356, filed Feb. 17, 2013, 31 pages.
Piltch,"ASUS Eee Pad Slider SL101 Review", Retrieved from <http://www.laptopmag.com/review/tablets/asus-eee-pad-slider-sl101.aspx>, Sep. 22, 2011, 5 pages.
Post,"E-Broidery: Design and Fabrication of Textile-Based Computing", IBM Systems Journal, vol. 39, Issue 3 & 4, Jul. 2000, pp. 840-860.
Poupyrev,"Ambient Touch: Designing Tactile Interfaces for Handheld Devices", In Proceedings of the 15th Annual ACM Symposium on User Interface Software and Technology Available at: <http://www.ivanpoupyrev.com/e-library/2002/uist2002_ambientouch.pdf>, Oct. 27, 2002, 10 pages.
Purcher,"Apple is Paving the Way for a New 3D GUI for IOS Devices", Retrieved from: <http://www.patentlyapple.com/patently-apple/2012/01/apple-is-paving-the-way-for-a-new-3d-gui-for-ios-devices.html> on Jun. 4, 2012, Retrieved from: <http://www.patentlyapple.com/patently-apple/2012/01/apple-is-paving-the-way-for-a-new-3d-gui-for-ios-devices.html> on Jun. 4, 2012, Jan. 12, 2012, 15 pages.
Qin,"pPen: Enabling Authenticated Pen and Touch Interaction on Tabletop Surfaces", In Proceedings of ITS 2010—Available at <http://www.dfki.de/its2010/papers/pdf/po172.pdf>, Nov. 2010, pp. 283-284.
Reilink,"Endoscopic Camera Control by Head Movements for Thoracic Surgery", In Proceedings of 3rd IEEE RAS & EMBS International Conference of Biomedical Robotics and Biomechatronics, retrieved from <http://doc.utwente.nl/74929/1/biorob_online.pdf> on Jun. 1, 2012, Sep. 26, 2010, pp. 510-515.
Rendl,"PyzoFlex: Printed Piezoelectric Pressure Sensing Foil", In Proceedings of the 25th Annual ACM Symposium on User Interface Software and Technology, Oct. 7, 2012, 10 pages.
Shaw,"Input Device Configuration having Capacitive and Pressure Sensors", U.S. Appl. No. 14/033,510, filed Sep. 22, 2013, 55 pages.
Staff,"Gametel Android controller turns tablets, phones into portable gaming devices", Retrieved from <http://www.mobiletor.com/2011/11/18/gametel-android-controller-turns-tablets-phones-into-portable-gaming-devices/#> on Nov. 20, 2012, Nov. 18, 2011, 5 pages.
Sumimoto,"Touch & Write: Surface Computing With Touch and Pen Input", Retrieved from: <http://www.gottabemobile.com/2009/08/07/touch-write-surface-computing-with-touch-and-pen-input/> on Jun. 19, 2012, Aug. 7, 2009, 4 pages.
Sundstedt,"Gazing at Games: Using Eye Tracking to Control Virtual Characters", In ACM SIGGRAPH 2010 Courses, retrieved from <http://www.tobii.com/Global/Analysis/Training/EyeTrackAwards/veronica_sundstedt.pdf> on Jun. 1, 2012, Jul. 28, 2010, 85 pages.
Takamatsu,"Flexible Fabric Keyboard with Conductive Polymer-Coated Fibers", In Proceedings of Sensors 2011, Oct. 28, 2011, 4 pages.
Travis,"Collimated Light from a Waveguide for a Display Backlight", Optics Express, 19714, vol. 17, No. 22, retrieved from <http://download.microsoft.com/download/D/2/E/D2E425F8-CF3C-4C71-A4A2-70F9D4081007/OpticsExpressbacklightpaper.pdf> on Oct. 15, 2009, Oct. 15, 2009, 6 pages.
Travis,"The Design of Backlights for View-Sequential 3D", retrieved from <http://download.microsoft.com/download/D/2/E/D2E425F8-CF3C-4C71-A4A2-70F9D4081007/Backlightforviewsequentialautostereo.docx> on Nov. 1, 2010, 4 pages.
Tuite,"Haptic Feedback Chips Make Virtual-Button Applications on Handheld Devices a Snap", Retrieved at: http://electronicdesign.com/analog/haptic-feedback-chips-make-virtual-button-applications-handheld-devices-snap, Sep. 10, 2009, 7 pages.
Valli,"Notes on Natural Interaction", retrieved from <http://www.idemployee.id.tue.nl/g.w.m.rauterberg/lecturenotes/valli-2004.pdf> on Jan. 5, 2012, Sep. 2005, 80 pages.

(56) References Cited

OTHER PUBLICATIONS

Valliath,"Design of Hologram for Brightness Enhancement in Color LCDs", Retrieved from <http://www.loreti.it/Download/PDF/LCD/44_05.pdf> on Sep. 17, 2012, May 1998, 5 pages.

Vaucelle,"Scopemate, A Robotic Microscope!", Architectradure, retrieved from <http://architectradure.blogspot.com/2011/10/at-uist-this-monday-scopemate-robotic.html> on Jun. 6, 2012, Oct. 17, 2011, 2 pages.

Williams,"A Fourth Generation of LCD Backlight Technology", Retrieved from <http://cds.linear.com/docs/Application%20Note/an65f.pdf>, Nov. 1995, 124 pages.

Xu,"Hand Gesture Recognition and Virtual Game Control Based on 3D Accelerometer and EMG Sensors", IUI'09, Feb. 8-11, 2009, retrieved from <http://sclab.yonsei.ac.kr/courses/10TPR/10TPR.files/Hand%20Gesture%20Recognition%20and%20Virtual%20Game%20Control%20based%20on%203d%20accelerometer%20and%20EMG%20sensors.pdf> on Jan. 5, 2012, Feb. 8, 2009, 5 pages.

Xu,"Vision-based Detection of Dynamic Gesture", ICTM'09, Dec. 5-6, 2009, retrieved from <http://ieeexplore.ieee.org/stamp/stamp.jsp?tp=&arnumber=5412956> on Jan. 5, 2012, Dec. 5, 2009, pp. 223-226.

Zhang,"Model-Based Development of Dynamically Adaptive Software", In Proceedings of ICSE 2006, Available at <http://www.irisa.fr/lande/lande/icse-proceedings/icse/p371.pdf>, May 20, 2006, pp. 371-380.

Zhu,"Keyboard before Head Tracking Depresses User Success in Remote Camera Control", In Proceedings of 12th IFIP TC 13 International Conference on Human-Computer Interaction, Part II, retrieved from <http://csiro.academia.edu/Departments/CSIRO_ICT_Centre/Papers?page=5> on Jun. 1, 2012, Aug. 24, 2009, 14 pages.

"Corrected Notice of Allowance", U.S. Appl. No. 15/283,913, dated Sep. 27, 2017, 2 pages.

"Corrected Notice of Allowance", U.S. Appl. No. 15/283,913, dated Oct. 25, 2017, 2 pages.

"Non-Final Office Action", U.S. Appl. No. 13/974,994, dated Oct. 20, 2017, 32 pages.

"Notice of Allowance", U.S. Appl. No. 15/283,913, dated Sep. 6, 2017, 9 pages.

\* cited by examiner

INPUT DEVICE CONFIGURATION HAVING CAPACITIVE AND PRESSURE SENSORS

RELATED APPLICATIONS

This application claims is a continuation of U.S. patent application Ser. No. 14/033,510, filed Sep. 22, 2013 and titled "Input Device Configuration having Capacitive and Pressure Sensors," which claims priority to and is a continuation-in-part of U.S. patent application Ser. No. 13/974,749, filed Aug. 23, 2013 and titled "Input Device with Interchangeable Surface," which claims priority as a continuation-in-part of U.S. patent application Ser. No. 13/655,065, filed Oct. 18, 2012, and titled "Media Processing Input Device," which claims priority to U.S. Provisional Patent Application No. 61/659,364, filed Jun. 13, 2012, and titled "Music Blade," the disclosures of each of which are hereby incorporated by reference in their entirety.

BACKGROUND

Mobile computing devices have been developed to increase the functionality that is made available to users in a mobile setting. For example, a user may interact with a mobile phone, tablet computer, or other mobile computing device to check email, surf the web, compose texts, interact with applications, and so on. Because mobile computing devices are configured to be mobile, however, the mobile devices may be ill suited for intensive data entry operations.

For example, some mobile computing devices provide a virtual keyboard that is accessible using touchscreen functionality of the device. However, it may difficult to perform some tasks using a virtual keyboard such as inputting a significant amount of text, composing a document, and so forth. Moreover, virtual keyboards consume some screen real estate that may otherwise be used to display content. Thus, use of traditional virtual keyboards may be frustrating when confronted with some input scenarios.

SUMMARY

Input device configurations are described. In one or more implementations, an input device includes a sensor substrate having one or more conductors and a flexible contact layer spaced apart from the sensor substrate. The flexible contact layer is configured to flex to contact the sensor substrate to initiate an input of a computing device. The flexible contact layer includes a force concentrator pad that is configured to cause pressure to be channeled through the force concentrator pad to cause the flexible contact layer to contact the sensor substrate to initiate the input.

In one or more implementations, an input device includes a plurality of indications that are selectable to initiate corresponding inputs and pressure sensitive sensor nodes formed in an array such that each of the indications corresponds to a plurality of the pressure-sensitive keys to initiate the corresponding inputs. The formation of the plurality of pressure sensitive sensor nodes includes a sensor substrate having one or more conductors and a flexible contact layer spaced apart from the sensor substrate that is configured to flex to contact the sensor substrate to initiate the corresponding input of a computing device.

In one or more implementations, an input device includes a sensor substrate having one or more conductors, a flexible contact layer spaced apart from the sensor substrate that is configured to flex to contact the sensor substrate to initiate an input of a computing device. The flexible contact layer includes a surface having a force sensitive ink configured to contact the one or more conductors of the sensor substrate to initiate the input and a plurality of spacers formed on the surface.

In one or more implementations, an input device includes a capacitive sensor assembly arranged in an array that is configured to detect a location of an object that is proximal to a respective capacitive sensor of the capacitive sensor assembly and a pressure sensitive sensor assembly including a plurality of pressure sensitive sensor nodes that are configured to detect an amount of pressure applied by the object against a respective pressure sensitive sensor node of the pressure sensitive sensor assembly.

In one or more implementations, an object is detected that is located proximal to one or more capacitive sensors of an input device. The input device is configured to communicate one or more inputs to a computing device. Responsive to the detection, functionality of the input device that is not related to the capacitive sensors is caused to be placed in an operational state.

In one or more implementations, an input device includes a capacitive sensor array configured to detect proximity of an object and a plurality of pressure sensitive sensor nodes embedded as nodes in the capacitive sensor array. The plurality of pressure sensitive sensor nodes are configured to initiate corresponding inputs of a computing device, each of the plurality of pressure sensitive sensor nodes formed from flexible contact layer spaced apart from a sensor substrate.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Overview

Figure 1:
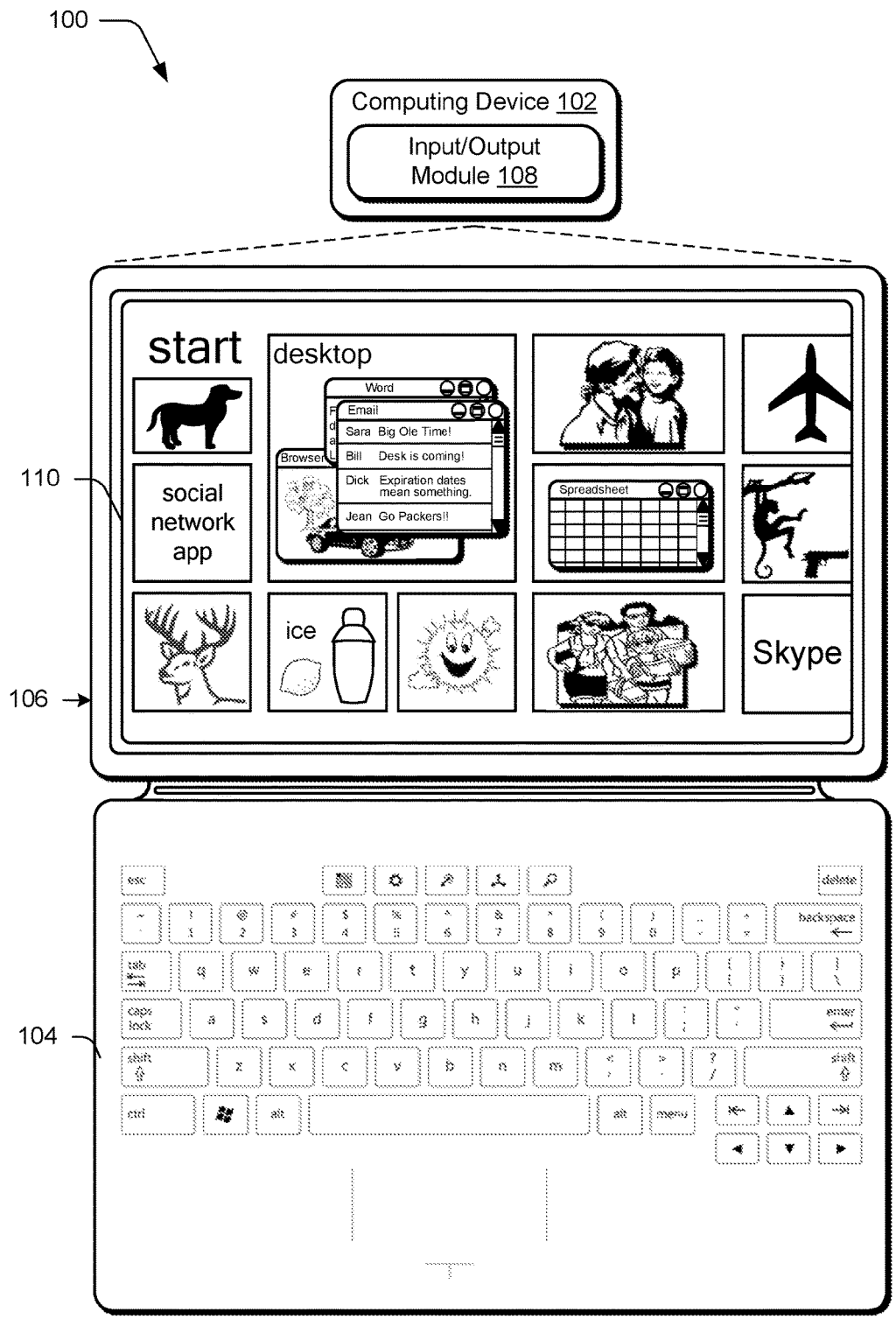
FIG. 1 is an illustration of an environment in an example implementation that is operable to employ the sensor configuration techniques described herein.

Mobile computing devices may be utilized in a wide variety of different scenarios due to their mobile construction, e.g., configured to be held by one or more hands of a user. As previously described, however, conventional techniques that were utilized to interact with these mobile computing devices could be limited when restricted solely to a virtual keyboard. Although supplemental input devices have been developed (e.g., an external keyboard), these devices could be unwieldy and difficult to interact with in mobile scenarios, including limitations in inputs that are recognized by the input device, difficulty in transporting the devices, and so forth.

Input device configurations are described. In one or more implementations, an input device is configured to include a generally uniform array of pressure sensitive sensor nodes. The pressure sensitive sensor nodes may have a size and pitch that is sufficient to recognize gestures, e.g., made by a finger of a user's hand, a stylus, and so on, by detecting an input as involving motion across a plurality of the keys. Additionally, the array may also be configured such that collections of the pressure sensitive sensor nodes are mapped to particular inputs (e.g., keys of a keyboard) to also function as a keyboard, track pad, and so on. The input device may be configured in a variety of ways to implement pressure sensitive sensor nodes having this functionality. The input device may also be configured to promote a relative thin form factor for the input device overall, e.g., less than three millimeters. This may be performed through use of force concentrator pads, integrated spacers, and so on. In this way, the input device may be configured to support a variety of different types of input functionality and may do so in a manner that maintains mobility of the mobile computing device to which it may be attached.

Additionally, the input device may also be configured to incorporate a capacitive sensor assembly. For instance, the capacitive sensor assembly may be configured to detect proximity of an object, and when so detected, wake other functionality of the input device (e.g., backlighting, operation of the pressure sensitive sensor nodes, and so on) and/or a computing device communicatively coupled to the input device. The capacitive sensor assembly may also operate in conjunction with the pressure sensitive sensor nodes to expose inputs having an increased richness to a computing device. The capacitive sensor assembly, for instance, may be employed to provide a location of an object and the pressure sensitive sensor nodes may be utilized to indicate an amount of pressure (i.e., a "z" indication). These inputs may be leveraged by the computing device to recognize gestures, gaming inputs, and so on and thus may provide increased input functionality to a user. A variety of other examples are also contemplated, further discussion of which may be found in relation to the following sections.

In the following discussion, an example environment is first described that may employ the input device configuration techniques described herein. Examples of layers that are usable in the example environment (i.e., the input device) are then described which may be performed in the example environment as well as other environments. Consequently, use of the example layers is not limited to the example environment and the example environment is not limited to use of the example layers.

Example Environment

FIG. 1 is an illustration of an environment 100 in an example implementation that is operable to employ the techniques described herein. The illustrated environment 100 includes an example of a computing device 102 that is physically and communicatively coupled to an input device 104 via a flexible hinge 106. The computing device 102 may be configured in a variety of ways. For example, the computing device 102 may be configured for mobile use, such as a mobile phone, a tablet computer as illustrated, and so on that is configured to be held by one or more hands of a user. Thus, the computing device 102 may range from full resource devices with substantial memory and processor resources to a low-resource device with limited memory and/or processing resources. The computing device 102 may also relate to software that causes the computing device 102 to perform one or more operations.

The computing device 102, for instance, is illustrated as including an input/output module 108. The input/output module 108 is representative of functionality relating to processing of inputs and rendering outputs of the computing device 102. A variety of different inputs may be processed by the input/output module 108, such as inputs relating to functions that correspond to keys of the input device 104, keys of a virtual keyboard displayed by the display device 110 to identify gestures and cause operations to be performed that correspond to the gestures that may be recognized through the input device 104 and/or touchscreen functionality of the display device 110, and so forth. Thus, the input/output module 108 may support a variety of different input techniques by recognizing and leveraging a division between types of inputs including key presses, gestures, and so on.

In the illustrated example, the input device 104 is configured as having an input portion that includes a keyboard having a QWERTY arrangement of keys and track pad although other arrangements of keys are also contemplated. Further, other non-conventional configurations are also contemplated, such as a game controller, configuration to mimic a musical instrument, and so forth. Thus, the input device 104 and keys incorporated by the input device 104 may assume a variety of different configurations to support a variety of different functionality.

As previously described, the input device 104 is physically and communicatively coupled to the computing device 102 in this example through use of a flexible hinge 106. The flexible hinge 106 is flexible in that rotational movement supported by the hinge is achieved through flexing (e.g., bending) of the material forming the hinge as opposed to mechanical rotation as supported by a pin, although that embodiment is also contemplated. Further, this flexible rotation may be configured to support movement in one or more directions (e.g., vertically in the figure) yet restrict movement in other directions, such as lateral movement of the input device 104 in relation to the computing device 102. This may be used to support consistent alignment of the input device 104 in relation to the computing device 102, such as to align sensors used to change power states, application states, and so on.

The flexible hinge 106, for instance, may be formed using one or more layers of fabric and include conductors formed as flexible traces to communicatively couple the input device 104 to the computing device 102 and vice versa. This communication, for instance, may be used to communicate a result of a key press to the computing device 102, receive power from the computing device, perform authentication, provide supplemental power to the computing device 102, and so on.

Figure 2:
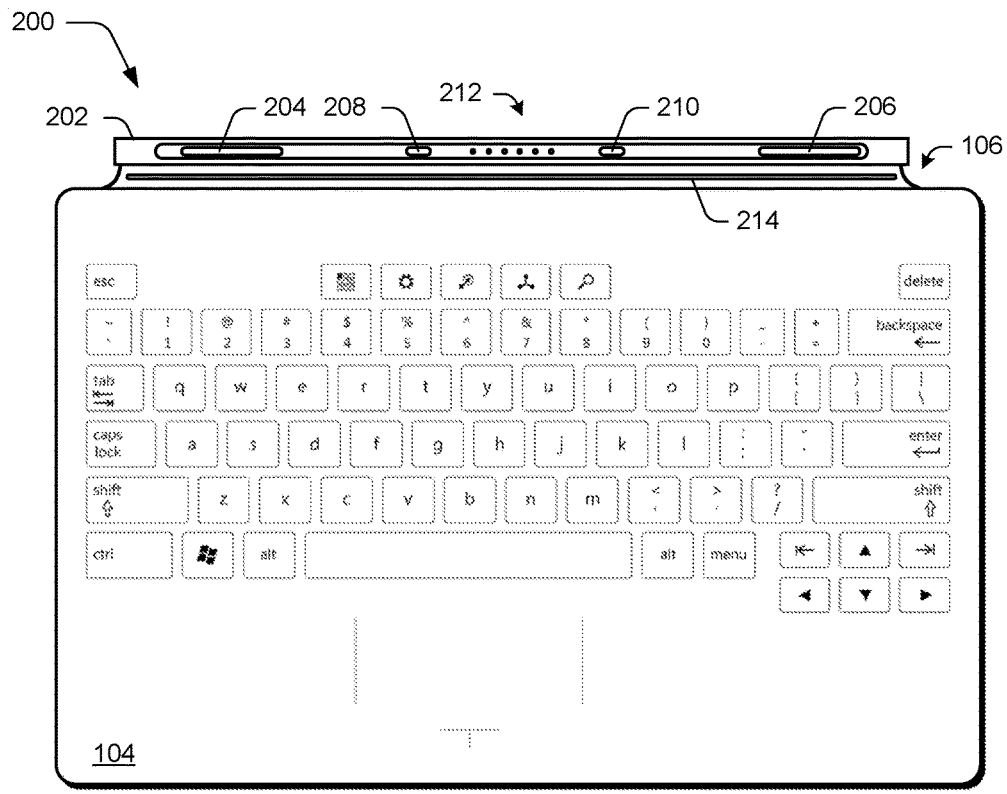
FIG. 2 depicts an example implementation of an input device of FIG. 1 as showing a flexible hinge in greater detail.

FIG. 2 depicts an example implementation 200 of the input device 104 of FIG. 1 as showing the flexible hinge 106 in greater detail. In this example, a connection portion 202 of the input device is shown that is configured to provide a communicative and physical connection between the input device 104 and the computing device 102. The connection portion 202 as illustrated has a height and cross section configured to be received in a channel in the housing of the computing device 102, although this arrangement may also be reversed without departing from the spirit and scope thereof.

The connection portion 202 is flexibly connected to a portion of the input device 104 that includes the keys through use of the flexible hinge 106. Thus, when the connection portion 202 is physically connected to the computing device 102 the combination of the connection portion 202 and the flexible hinge 106 supports movement of the input device 104 in relation to the computing device 102 that is similar to a hinge of a book.

Through this rotational movement, a variety of different orientations of the input device 104 in relation to the computing device 102 may be supported. For example, rotational movement may be supported by the flexible hinge 106 such that the input device 104 may be placed against the display device 110 of the computing device 102 and thereby act as a cover. Thus, the input device 104 may act to protect the display device 110 of the computing device 102 from harm.

The connection portion 202 may be secured to the computing device in a variety of ways, an example of which is illustrated as including magnetic coupling devices 204, 206 (e.g., flux fountains), mechanical coupling protrusions 208, 210, and a plurality of communication contacts 212. The magnetic coupling devices 204, 206 are configured to magnetically couple to complementary magnetic coupling devices of the computing device 102 through use of one or more magnets. In this way, the input device 104 may be physically secured to the computing device 102 through use of magnetic attraction.

The connection portion 202 also includes mechanical coupling protrusions 208, 210 to form a mechanical physical connection between the input device 104 and the computing device 102. The mechanical coupling protrusions 208, 210 are shown in greater detail in relation to FIG. 3, which is discussed below.

Figure 3:
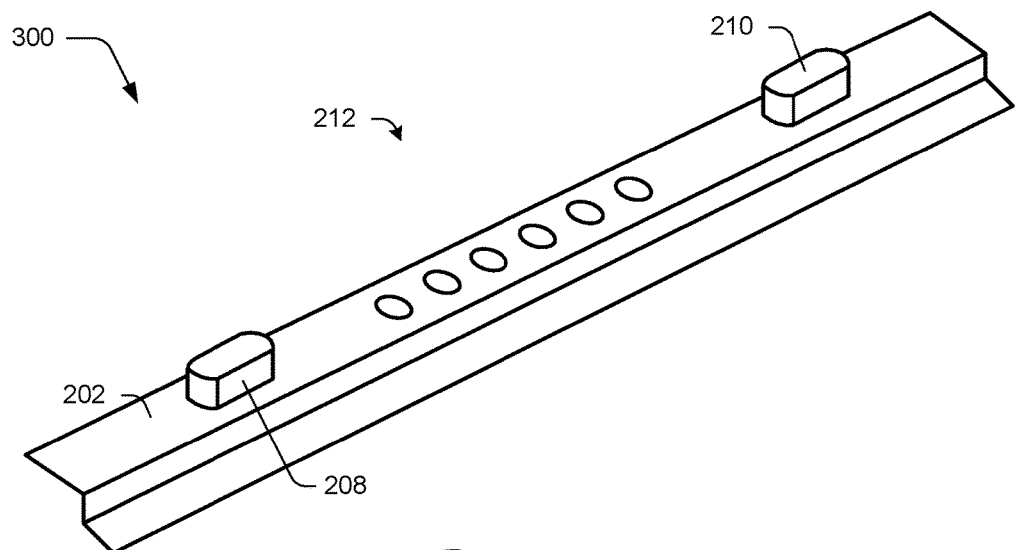
FIG. 3 depicts an example implementation showing a perspective view of a connection portion of FIG. 2 that includes mechanical coupling protrusions and a plurality of communication contacts.

FIG. 3 depicts an example implementation 300 showing a perspective view of the connection portion 202 of FIG. 2 that includes the mechanical coupling protrusions 208, 210 and the plurality of communication contacts 212. As illustrated, the mechanical coupling protrusions 208, 210 are configured to extend away from a surface of the connection portion 202, which in this case is perpendicular although other angles are also contemplated.

The mechanical coupling protrusions 208, 210 are configured to be received within complimentary cavities within the channel of the computing device 102. When so received, the mechanical coupling protrusions 208, 210 promote a mechanical binding between the devices when forces are applied that are not aligned with an axis that is defined as correspond to the height of the protrusions and the depth of the cavity.

The connection portion 202 is also illustrated as including a plurality of communication contacts 212. The plurality of communication contacts 212 is configured to contact corresponding communication contacts of the computing device 102 to form a communicative coupling between the devices as shown. The connection portion 202 may be configured in a variety of other ways, including use of a rotational hinge, mechanical securing device, and so on. In the following, an example of a docking apparatus 112 is described and shown in a corresponding figure.

Figure 4:
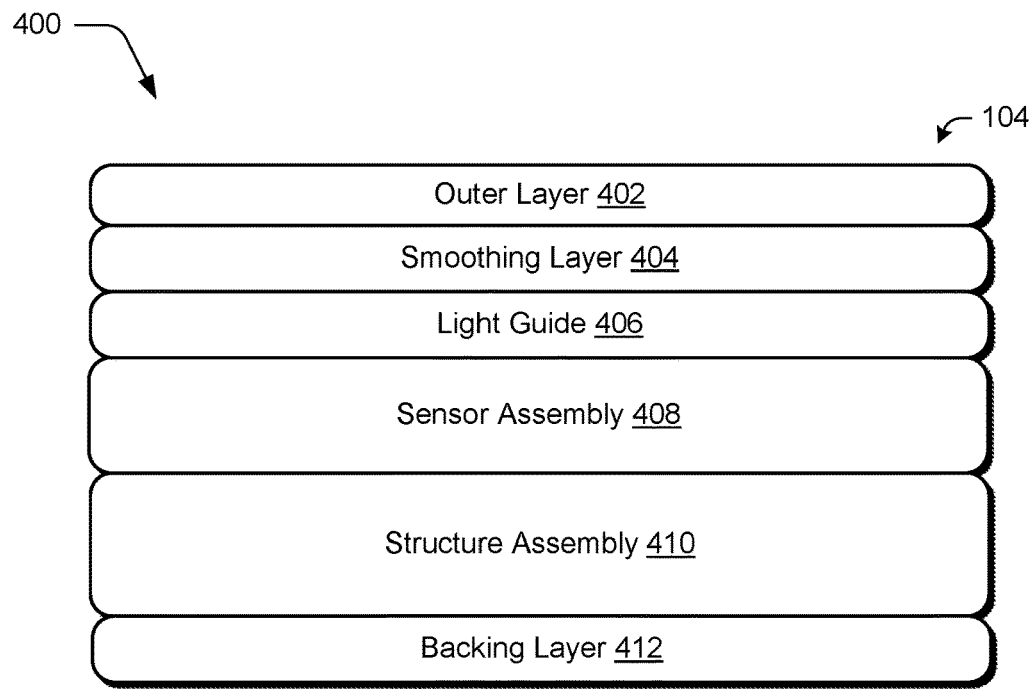
FIG. 4 depicts an example implementation showing a cross section of the input device of FIG. 1.

FIG. 4 depicts an example implementation 400 showing a cross section of input device 104 of FIG. 1. The outer layer 402 is configured to supply an outer surface of the input device 104 with which a user may touch and interact. The outer layer 402 may be formed in a variety of ways, such as from a fabric material, e.g., a backlight compatible polyurethane with a heat emboss for key formation, use of a laser to form indications of inputs, and so on.

Beneath the outer layer is a smoothing layer 404. The smoothing layer 404 may be configured to support a variety of different functionality. This may include use as a support to reduce wrinkling of the outer layer 402, such as through formation as a thin plastic sheet, e.g., approximately 0.125 millimeters of polyethylene terephthalate (PET), to which the outer layer 402 is secured through use of an adhesive. The smoothing layer 404 may also be configured to including masking functionality to reduce and even eliminate unwanted light transmission, e.g., "bleeding" of light through the smoothing layer 404 and through a fabric outer layer 402. The smoothing layer also provides a continuous surface under the outer layer, such that it hides any discontinuities or transitions between the inner layers.

A light guide 406 is also illustrated, which may be included as part of a backlight mechanism to support backlighting of indications (e.g., legends) of inputs of the input device 104. This may include illumination of keys of a keyboard, game controls, gesture indications, and so on. The light guide 406 may be formed in a variety of ways, such as from a 250 micron thick sheet of a plastic, e.g., a clear polycarbonate material with etched texturing. Additional discussion of the light guide 406 may be found beginning in relation to FIG. 5.

A sensor assembly 408 is also depicted. Thus, as illustrated the light guide 406 and the smoothing layer 404 are disposed between the outer layer 402 and the sensor assembly 408. The sensor assembly 408 is configured detect proximity of an object to initiate an input. The detected input may then be communicated to the computing device 102 (e.g., via the connection portion 202) to initiate one or more operations of the computing device 102. The sensor assembly 408 may be configured in a variety of ways to detect proximity of inputs, such as a capacitive sensor array, a plurality of pressure sensitive sensor nodes (e.g., membrane switches using a force sensitive ink), mechanical switches, a combination thereof, and so on.

A structure assembly 410 is also illustrated. The structure assembly 410 may be configured in a variety of ways, such as a trace board and backer that are configured to provide rigidity to the input device 104, e.g., resistance to bending and flexing. A backing layer 412 is also illustrated as providing a rear surface to the input device 104. The backing layer 412, for instance, may be formed from a fabric similar to an outer layer 402 that omits one or more sub-layers of the outer layer 402, e.g., a 0.38 millimeter thick fabric made of wet and dry layers of polyurethane Although examples of layers have been described, it should be readily apparent that a variety of other implementations are also contemplated, including removal of one or more of the layers, addition of other layers (e.g., a dedicated force concentrator layer, mechanical switch layer), and so forth. Thus, the following discussion of examples of layers is not limited to incorporation of those layer in this example implementation 400 and vice versa.

Figure 5:
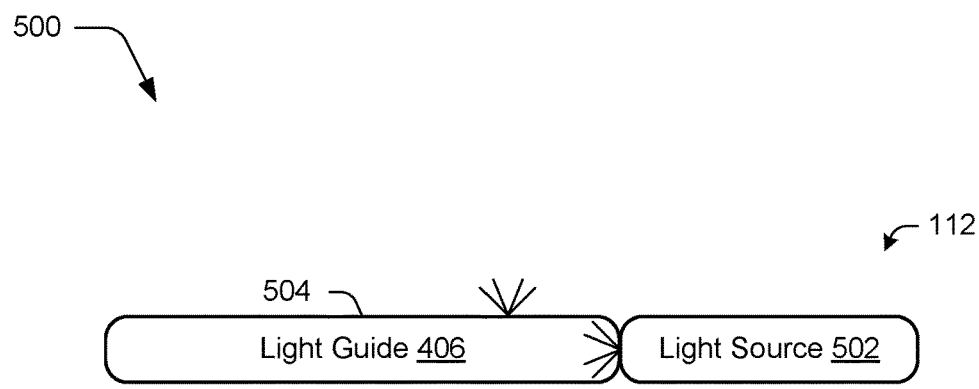
FIG. 5 depicts an example implementation of a backlight mechanism of FIG. 1 as including a light guide of FIG. 4 and a light source.

FIG. 5 depicts an example implementation 500 of a backlight mechanism as including a light guide 406 of FIG. 4 and a light source. As previously described, the light guide 406 may be configured in a variety of ways to support transmission of light that is to act as a backlight for the input device 102. For example, the light guide 406 may be configured from a clear plastic or other material that supports transmission of light from a light source 502, which may be implemented using one or more light emitting diodes (LEDs). The light guide 406 is positioned to receive the emitted light from the light source 502 through a side of the light guide 406 and emit the light through one or more other sides and/or surface regions of the light guide 406.

The light guide 406, for instance, may be configured to output light at specific locations through use of etching, embossing, contact by another material having a different refractive index (e.g., an adhesive disposed on the plastic of the light guide 406), and so on. In another example, the light guide 406 may be configured as a universal light guide such that a majority (and even entirety) of a surface of the light guide 406 may be configured output light, e.g., through etching of a majority of a surface 504 of the light guide 406. Thus, instead of specially configuring the light guide 406 in this example, the same light guide maybe used to output different indications of inputs, which may be used to support different languages, arrangements of inputs, and so on by the input device 104.

As previously described, however, this could cause bleeding of light through adjacent surfaces to the light guide in conventional techniques, such as through an outer layer 402 of fabric to give a "galaxy" effect, pinholes, and so on. Accordingly, one or more of these adjacent layers may be configured to reduce and even prevent transmission of light in undesirable locations. For example, the outer layer may include sub-layers having progressively darker shades of a color to enable use of a light surface color yet restrict transmission of light through the fabric, a mask of ink may be printed (e.g., to the smoothing layer 404) to absorb light at particular locations (e.g., near the light source), and so on. A variety of other examples are also contemplated.

Figure 6:
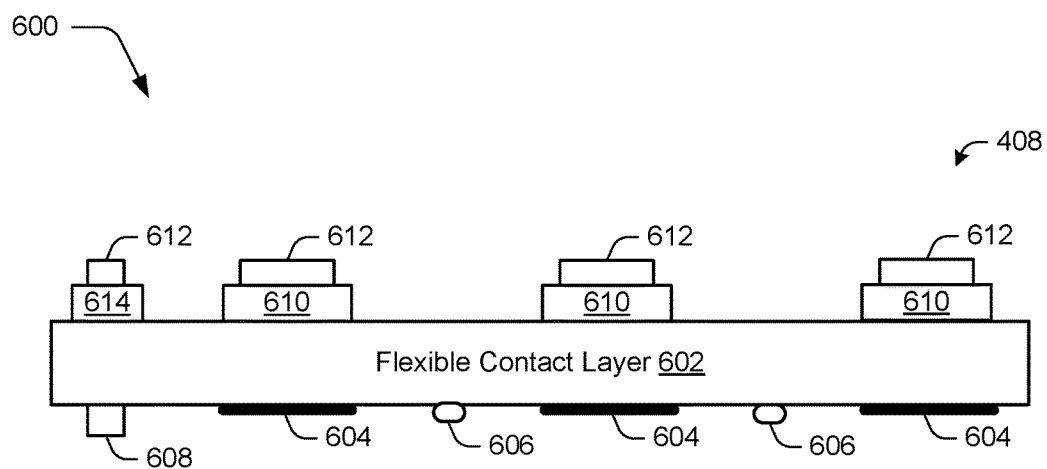
FIG. 6 depicts an example implementation in which a layer of the sensor assembly is shown in a cross section, the layer configured to support implementation of pressure sensitive sensor nodes.

FIG. 6 depicts an example implementation 600 in which a layer of the sensor assembly 408 is shown in a cross section, the layer configured to support implementation of pressure sensitive sensor nodes. A flexible contact layer 602 (e.g., Mylar) of a pressure sensitive sensor node is illustrated in this example that is configured to flex to initiate contact and thus an input. In this example, the flexible contact layer 402 does not performed this contact absent application of pressure against the flexible contact layer 602 as further described in relation to FIG. 7.

Figure 7:
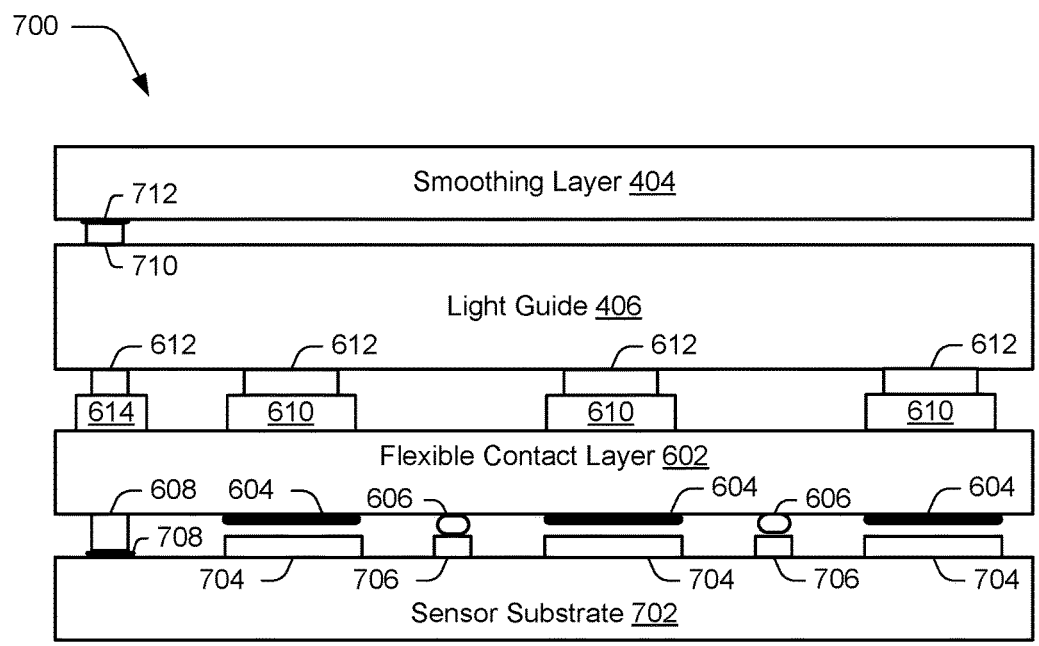
FIG. 7 depicts an example implementation in which a flexible contact layer of FIG. 6 is shown in cross section as combined with a sensor substrate to form a pressure sensitive sensor node assembly.

The flexible contact layer 602 in this example includes a force sensitive ink 604 disposed on a surface of the flexible contact layer 602. The force sensitive ink 604 is configured such that an amount of resistance of the ink varies directly in relation to an amount of pressure applied. The force sensitive ink 604, for instance, may be configured with a relatively rough surface that is compressed against another surface (e.g., a conductor as shown in FIG. 7) upon an application of pressure against the flexible contact layer 602. The greater the amount of pressure, the more the force sensitive ink 604 is compressed, thereby increasing conductivity and decreasing resistance of the force sensitive ink 604. Other conductors may also be disposed on the flexible contact layer 604 without departing form the spirit and scope therefore, including other types of pressure sensitive and non-pressure sensitive conductors.

The flexible contact layer 602 is also illustrated as including spacers 606 formed on the same surface of the flexible contact layer 602 as the force sensitive ink 604. The spacers 606 define openings through which the flexible contact layer 602 is to flex to initiate inputs. The spacers 606 may be configured in a variety of ways, such as through use of a dielectric spacer material having a height of approximately 6.5 um. The flexible contact layer 602 is also illustrated as including a securing mechanism 608 (e.g., 25 um of adhesive) to secure the flexible contact layer 602 to an adjacent layer of the pressure sensitive sensor node assembly.

Force contractor pads 610 are also illustrated as disposed on an opposing side of the flexible contact layer 602 in relation to the side of flexible contact layer 602 that includes the force sensitive ink 604. The force concentrator pads 610 are illustrated as secured to and/or a part of the flexible contact layer 602, such as formed from a material to have a height of approximately 50 um. The force concentrator pads have a cross section along an axis of the flexible contact layer 602 that approximates a cross section of the force sensitive ink 604 disposed on an opposing side of the flexible contact layer 602. The force concentrator pads 610 may be configured to channel pressure applied to the input device 104 to promote consistent contact of the force sensitive ink 606, further discussion of which may be found beginning in relation to the discussion of FIG. 8.

FIG. 7 depicts an example implementation 700 in which the flexible contact layer 602 of FIG. 6 is shown in cross section as combined with a sensor substrate 702 to form a pressure sensitive sensor node assembly. The sensor substrate 702 may be configured in a variety of ways, such as a printed circuit board (PCB) having conductors 704 disposed thereon.

The conductors 704 are configured to be contacted by the force sensitive ink 604 of the flexible contact layer 602. When contacted, an analog signal may be generated for processing by the input device 104 and/or the computing device 102, e.g., to recognize whether the signal is likely intended by a user to provide an input for the computing device 102. A variety of different types of conductors 704 may be disposed on the sensor substrate 702, such as formed from a variety of conductive materials (e.g., silver, copper), disposed in a variety of different configurations as further described in relation to FIG. 10, and so on.

The sensor substrate 702 is also illustrated as including spacers 706. The spacers 706 are disposed on the same surface as the conductors 704 on the sensor substrate 702 in an area between the conductors. The spacers 706 of the sensor substrate 702 and the spacers 606 of the flexible contact layer 602 may be positioned to form a spacer assembly as shown in the figure, e.g., having a total height of 41 um. This height may thus cause the force sensitive ink 604 of the flexible contact layer 602 to be spaced apart from the conductors 604 of the sensor substrate 702.

Application of a pressure against the flexible contact layer 602 may cause the flexible contact layer 602 to flex through an opening formed by the spacer assembly to contact the conductors 704 of the sensor substrate 702. As previously described, the amount of pressure may be communicated through different resistances of the force sensitive ink 604 to provide an output that indicates an amount of pressure that was applied, e.g., with twelve bits of resolution as further described below.

The securing mechanism 608 (e.g., the adhesive described in relation to FIG. 6) may be used to secure the flexible contact layer 602 to the sensor substrate 702. This may be performed directly to a surface of the sensor substrate 702, include use of a solder mask 708 having a height approximating the force sensitive ink 604 to increase a height of a gap between the ink and the conductors 704, and so on.

The flexible contact layer 602 is also illustrated as secured to the light guide 406 through use of the previously described adhesives 612. As this may cause light to bleed from the light guide 406, the flexible contact layer 602 may be configured to promote reflectance of this light (e.g., by being colored white). Additionally, to reduce an amount of light bleed "upward" through the smoothing layer 404 and outer surface 402 of FIG. 4, a lesser surface area of adhesive 710 may be used to secure the smoothing layer 404 to the light guide 406 than is used to secure the light guide 406 to the flexible contact layer 602. Other techniques may also be utilized to reduce this light bleed, such as to include a mask 712 printed as a black ink to portions of the smoothing layer 404 that are secured to the light guide 406, e.g., that have adhesive disposed thereon.

Figure 8:
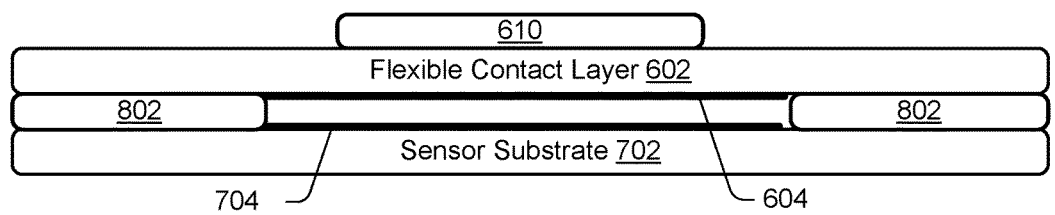
FIG. 8 depicts an example implementation of a pressure sensitive sensor node of FIGS. 6 and 7 as employing a force concentrator pad.

FIG. 8 depicts an example implementation 800 of a pressure sensitive sensor node of FIGS. 6 and 7 as employing a force concentrator pad 610. In this example, the flexible contact layer 602 is spaced apart from the sensor substrate 702 through use of a space assembly 802, which may employ the spacers 606, 706 of FIGS. 6 and 7. The force concentrator pad 610 may be implemented in a variety of ways, such as part of the flexible contact layer 602 as illustrated, as a stand-alone layer, as part of a smoothing layer 404, and so on.

As previously described, the flexible contact layer 602 may be configured from a variety of materials, such as a flexible material (e.g., Mylar) that is capable of flexing to contact a sensor substrate 702. The flexible contact layer 602 in this instance includes a force concentrator pad 610 disposed thereon that is raised from a surface of the flexible contact layer 602. Thus, the force concentrator pad 610 is configured as a protrusion to contact another layer of the input device 104, such as the light guide 406, smoothing layer 404, outer surface 402, and so on. The force concentrator pad 610 may be formed in a variety of ways, such as formation as a layer (e.g., printing, deposition, forming, etc.) on a substrate of the flexible contact layer 602 (e.g., Mylar), as an integral part of the substrate itself, and so on.

Figure 9:
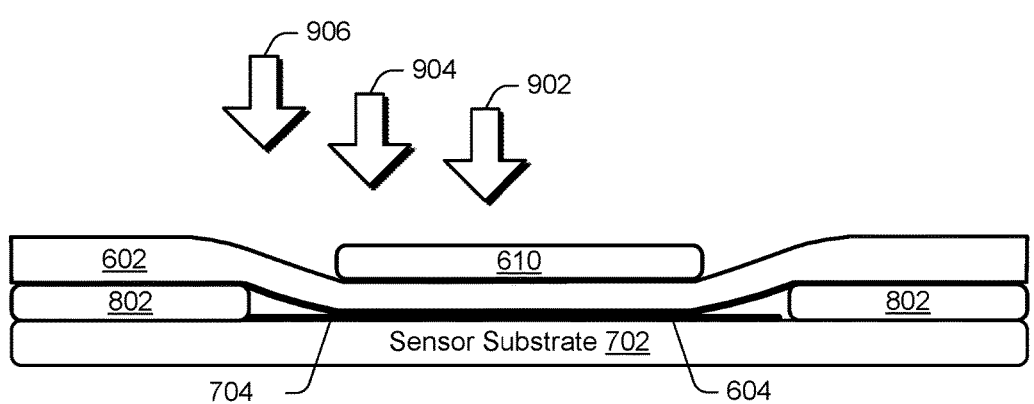
FIG. 9 an example of the pressure sensitive sensor node of FIG. 8 as having pressure applied at a plurality of different locations of the flexible contact layer to cause contact with the sensor substrate.

FIG. 9 an example 900 of the pressure sensitive sensor node 800 of FIG. 8 as having pressure applied at a plurality of different locations of the flexible contact layer 602 to cause contact with the sensor substrate 702. The pressure is illustrated through use of arrows, which in this instance include first, second, and third locations 902, 904, 906 which are positioned at distances that are respectively closer to an edge of the sensor, e.g., an edge defined by the spacer assemblies 802.

As illustrated, the force concentrator pad 610 is sized so as to permit the flexible contact layer 602 to flex between the spacer assemblies 802. The force concentrator pad 610 is configured to provide increased mechanical stiffness and thus improved resistance to localized bending and flexing around a single sensor, e.g., as in comparison with a substrate (e.g., Mylar) of the flexible contact layer 602 alone. Therefore, when the force concentrator pad 610 receives pressures (e.g., is "pressed"), the flexible contact layer 602 has a decreased bend radius than would otherwise be the case.

Thus, the bending of a substrate of the flexible contact layer 602 around the force concentrator pad 610 may promote a relatively consistent contact area between the force sensitive ink 604 and the conductors 704 of the sensor substrate 702. This may promote normalization of a signal produced by the key, e.g., to address "off center" contact.

The force concentrator pad 610 may also act to spread a contact area of a source of the pressure. The flexible contact layer 602, for instance, may receive a pressure caused by a fingernail, a tip of a stylus, pen, or other object that has a relatively small contact area. This could result in correspondingly small contact area of the flexible contact layer 602 that contacts the sensor substrate 702, and thus a corresponding decrease in signal strength.

However, due to the mechanical stiffness of the force concentrator pad 610, this pressure may be spread across an area of the force concentrator pad 610, which is then spread across an area of the flexible contact layer 602 that correspondingly bends around the spacer assemblies 802 to contact the sensor substrate 702. In this way, the force concentrator pad 610 may be used to distribute and normalize a contact area between the flexible contact layer 602 and the sensor substrate 702 that is used to generate a signal by the pressure sensitive sensor node.

The force concentrator pad 610 may also act to channel pressure, even if this pressure is applied "off center." For example, the flexibility of the flexible contact layer 602 may depend at least partially on a distance from an edge of the pressure sensitive sensor node, e.g., an edge defined by the spacer assembly 802 in this instance.

The force concentrator pad 610, however, may be used to channel pressure to the flexible contact layer 602 to promote relatively consistent contact. For example, pressure applied at a first location 902 that is positioned at a general center region of the flexible contact layer 602 may cause contact that is similar to contact achieved when pressure applied at a second location 904 that is positioned at an edge of the force concentrator pad 610. Pressures applied outside of a region defined by the force concentrator pad 610 may also be channeled through use of the force concentrator pad 610, such as a third position 906 that is located outside of the region defined by the force concentrator pad 610 but within an edge of the key. A position that is located outside of a region of the flexible contact layer 602 defined by the spacer assembly 802 may also be channeled to cause the flexible contact layer 602 to contact the sensor substrate 702 as illustrated. A variety of different configurations of pressure sensitive sensor assemblies may leverage the pressures sensitive keys previously described, an example of which is described as follows and shown in a corresponding figure.

Figure 10:
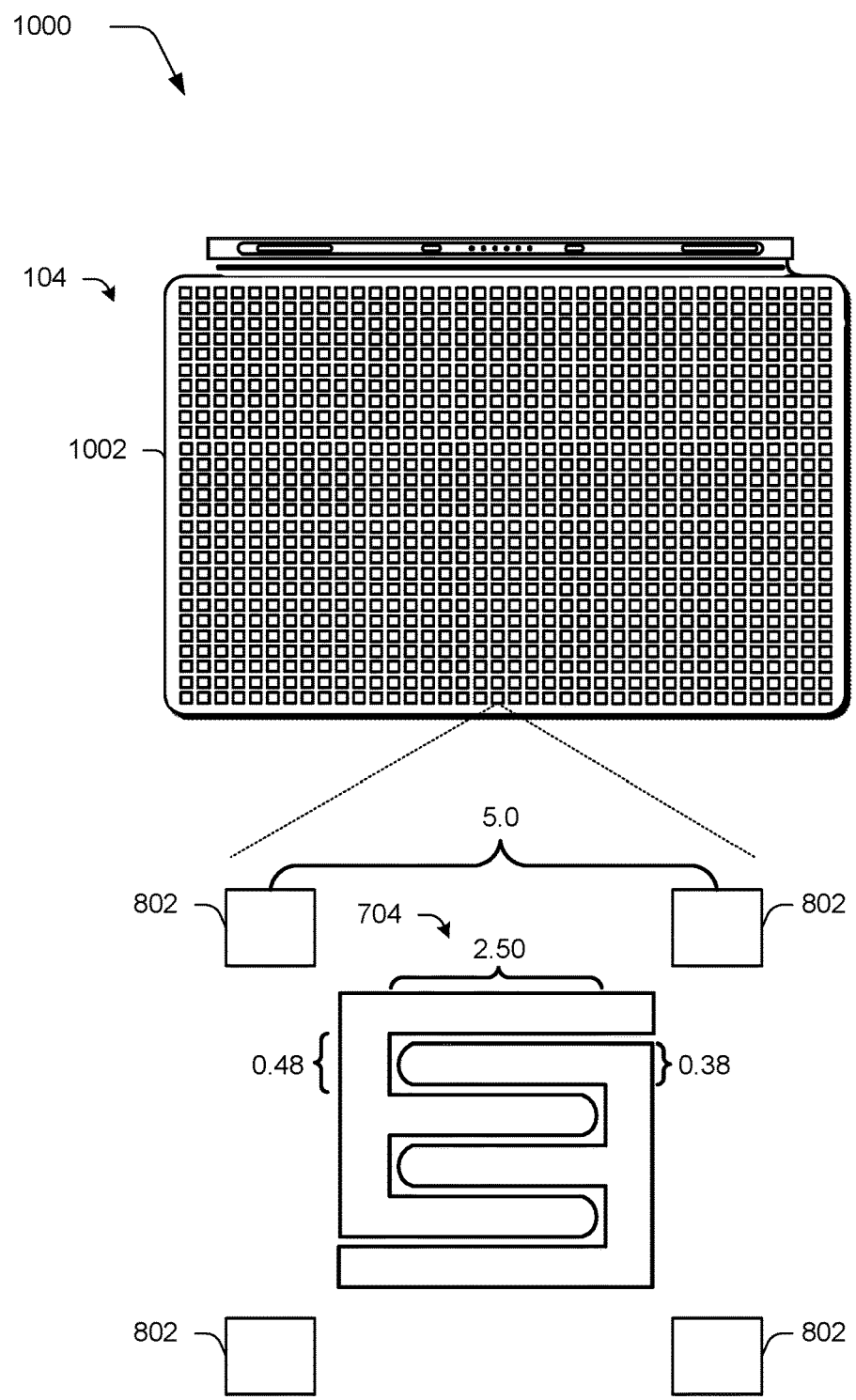
FIG. 10 depicts an example implementation in which a pressure sensitive sensor nodes are arranged in an array that is configured to support gesture detection and use for a plurality of different input configurations.

FIG. 10 depicts an example implementation 1000 in which a pressure sensitive sensor nodes are arranged in an array (e.g., a pool) that is configured to support gesture detection and use for a plurality of different input configurations. In this example, a pressure sensitive sensor assembly 1002 of the input device 104 includes a plurality of pressure sensitive sensor nodes, which are illustrated as having a generally uniform size and spacing in a square shape, although other sizes, spacings, and arrangements are also contemplated without departing from the spirit and scope thereof.

An enlarged example of a conductor 704 of the pressure sensitive sensor assembly 1002 is also shown. In this example, conductors 704 of the sensor substrate 702 are configured in first and second portions of inter-digitated trace fingers. Thus, a pressure applied to the flexible contact layer 602 may cause the force sensitive ink 604 to contact the conductors 804 and act as a shunt to permit a flow of electricity between the first and second portions of inter-digitated trace fingers. Other examples are also contemplated, such as to the first portion on the flexible contact layer 602 and the second portion on the sensor substrate 702 with the force sensitive ink being disposed between the layers having the portions.

In the illustrated example, the input device 104 includes an array of sensors spaced in a generally uniform manner, e.g., individual sensors placed approximately five millimeters apart on center in a grid arrangement. The sensors are illustrated as squares in the example although other sizes and arrangements are also contemplated, such as staggered generally circular sensors and so on. Further, the sensors may be configured in a variety of ways, such as pressure sensitive sensors, include a capacitive grid as described in relation to FIG. 13, and so on.

The size and spacing of the sensors may be configured in a variety of ways. For example, a surface area of the sensor may be configured to have a surface area of approximately 25 millimeters (e.g., a 5×5 square or less), may be configured to have a surface area of approximately nine millimeters (e.g., a 3×3 square), may be configured to have a surface area of approximately 2.25 millimeters (e.g., a 1.5×1.5 square configured to detect a fingernail, stylus, and so on), have a pitch of approximately five millimeters or less, and so on. Additionally, a variety of different detection and sampling rates may be supported, such as a one kilohertz sampling rate with twelve bits of resolution (e.g., to indicate pressure) and may be responsive to twenty five grams of pressure. In this way, the array may be configured to detect gestures across a sequence of the sensors, may support dynamic mapping of key presses to corresponding indications as described in relation to FIG. 11, and so on. It should be readily apparent that a wide variety of other examples are also contemplated. Regardless of how implemented, sensors of the array may thus correspond to indications of inputs of the outer surface 402 of the input device 104, further discussion of which is described as follows and shown in a corresponding figure.

Figure 11:
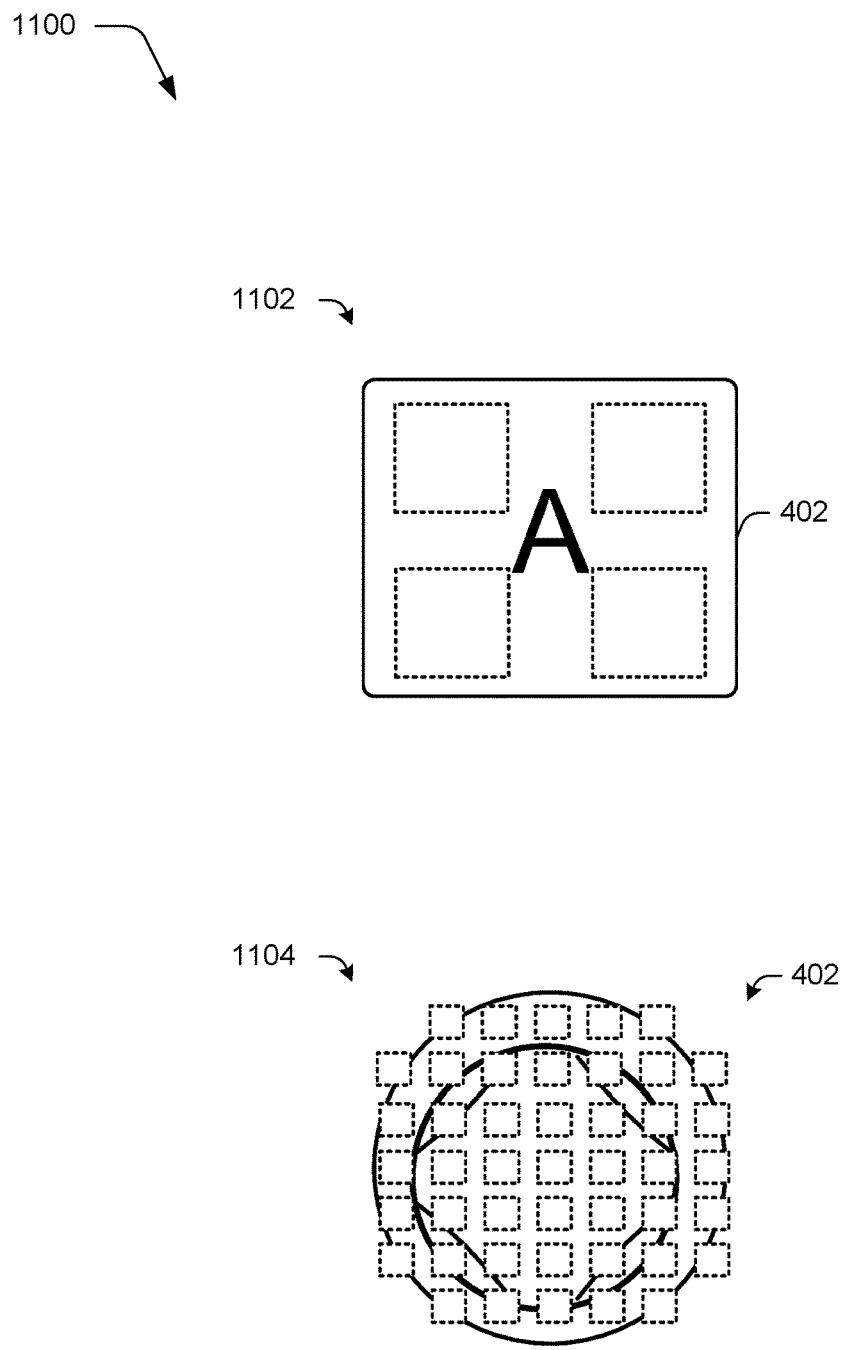
FIG. 11 depicts an implementation showing examples of indications of inputs of the outer layer of FIG. 4 as corresponding to a plurality of underlying pressure sensitive sensor nodes of an array of FIG. 10.

FIG. 11 depicts an implementation 1100 showing examples of indications 1102, 1104 of inputs of the outer layer 402 of FIG. 4 as corresponding to a plurality of underlying pressure sensitive sensor nodes of an array of FIG. 10. The first indication 402 is taken from the outer layer 402 and shows the letter "A" of a QWERTY keyboard that, once selected (e.g., pressed) is to cause a corresponding input to be provided by the input device 104 to the computing device 102.

The indication 1102 is disposed over four sensors of the array of the pressure sensitive sensor assembly 1002 of FIG. 10, which are illustrated in phantom. Accordingly, a mapping may be employed such that an output from any, all, or a combination thereof of these sensors is recognized by the computing device 102 as the indicated input, e.g., a key press of the letter "A."

Likewise, indication 1104 is taken from a game controller is of an input for a rocker control, such as to provide inputs to control direction of an object in a game. The indication 1104 is also disposed over a plurality of sensors (e.g., the pressure sensitive sensor nodes of the array of FIG. 10), which are also illustrated in phantom. Accordingly, a mapping may be employed such that an output from any, all, or a combination thereof of these sensors is recognized by the computing device 102 as the indicated input, e.g., different directions dependent on which part of the rocker control receives contact.

Additionally, techniques may be employed to detect a centroid of a contact to determine a likely intent of a contact received by a user. For the indication 1104 of the rocker control, for instance, a centroid of a user's finger may be detected to determine a likely direction. This technique may also be employed to determine which of a plurality of indications likely correspond to an input, such as when a user contacts a border between multiple indications the centroid may be used to determine which indication and corresponding sensor is likely intended as an input by a user. Capacitive sensors may also be incorporated to aid this detection as further described beginning in relation to FIG. 13. Although a generally uniform array of sensors was described, other arrangements may also be employed that are not uniform, e.g., to follow a configuration of a QWERTY keyboard and map other functionality such as a game controller over this configuration.

Figure 12:
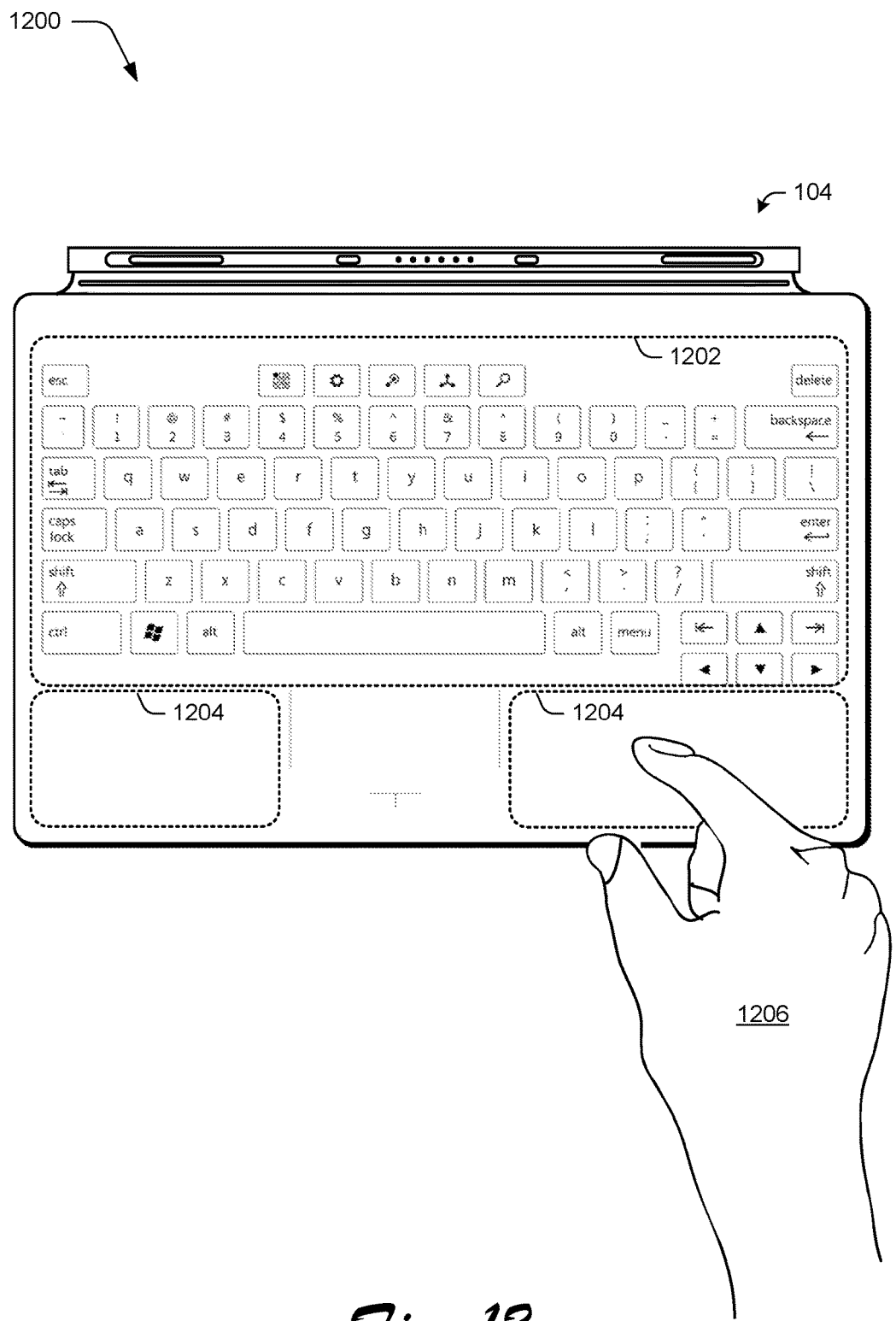
FIG. 12 depicts an example implementation of the input as including a pressure sensitive sensor assembly and a capacitive sensor assembly.

FIG. 12 depicts an example implementation 1200 of the input device 104 as including a pressure sensitive sensor assembly 1202 and a capacitive sensor assembly 1204. The pressure sensitive sensor assembly 1202 may be configured in a variety of ways, such as an array as described in relation to FIG. 10, one to one correspondence between indications of keys of FIG. 1 and underlying sensors, and so on. In the illustrated example, the pressure sensitive sensor assembly 1202 is illustrated in phantom as disposed underneath indications of keys of a keyboard of FIG. 1.

The input device 104 also includes capacitive sensor assemblies 1204 which are illustrated as disposed beneath palm rests of the input device 104 although other configurations as also contemplated as further described below. The capacitive sensor assemblies 1204 are configured to detect proximity of an object, such as a finger of a user's hand 1206 as illustrated, a stylus, or other object. This detection may be leveraged to support a wide variety of different functionality. For example, the capacitive sensor assemblies 1204 may remain operational (e.g., awake) while other functionality of the input device 104 (e.g., the pressure sensitive sensor node assembly 1202, backlighting, and so on), computing device 102, and so on are in a non-operational state, e.g., a sleep state, hibernation state, "off," and so on. This may be performed to reduce power consumption by these devices.

Responsive to detection of an object (e.g., the finger of the user's hand 1206), the input device 104 may cause this other functionality of the input device 104 and/or computing device 102 to "wake." For example, this may cause examination of an output of a camera of the computing device 102 and/or input device 104 to determine whether to turn the backlighting of the input device 104 "on" based on an amount of light detected in the surroundings of the device, place the pressure sensitive sensor assembly 1202 in an operational state to detect pressure, and so on. In this way, the capacitive sensor assembly 1204 may be utilized to conserve power consumed by the input device 104 and/or the computing device 102 as well as increase responsiveness of these devices, e.g., by waking before contact is even received by the pressure sensitive sensor node assembly. Additionally, this may be utilized to protect against inadvertent presses of the keys of the input device 104, such as in combination with detection of a location of the input device 104 in relation to the computing device 102, e.g., positioned at a rear of the computing device 102 through use of a Hall Effect sensor, accelerometers, magnetometers, and so forth.

The capacitive sensor assembly 1204 may be configured in a variety of ways to perform this object detection. For example, the capacitive sensor assembly 1204 may be configured in a portion of the input device 104 that is separate and non-overlapping from a portion including the pressure sensitive sensor assembly 1202 as shown in FIG. 12. In this example, the capacitive sensor assembly 1204 may be configured to detect presence of an object but not a specific location of the object beyond the presence of the object in a sensing range of capacitive sensors of the capacitive sensor assembly 1204. The capacitive sensor assembly 1204 may also be configured to be interspersed between the pressure sensitive sensor nodes of the pressure sensitive sensor node assembly, an example of which is described in relation to FIG. 13. In yet another example, the capacitive sensor assembly 1204 may be formed as a layer that is disposed proximal to a layer of the pressure sensitive sensor node assembly, an example of which is described in relation to FIG. 14.

Figure 13:
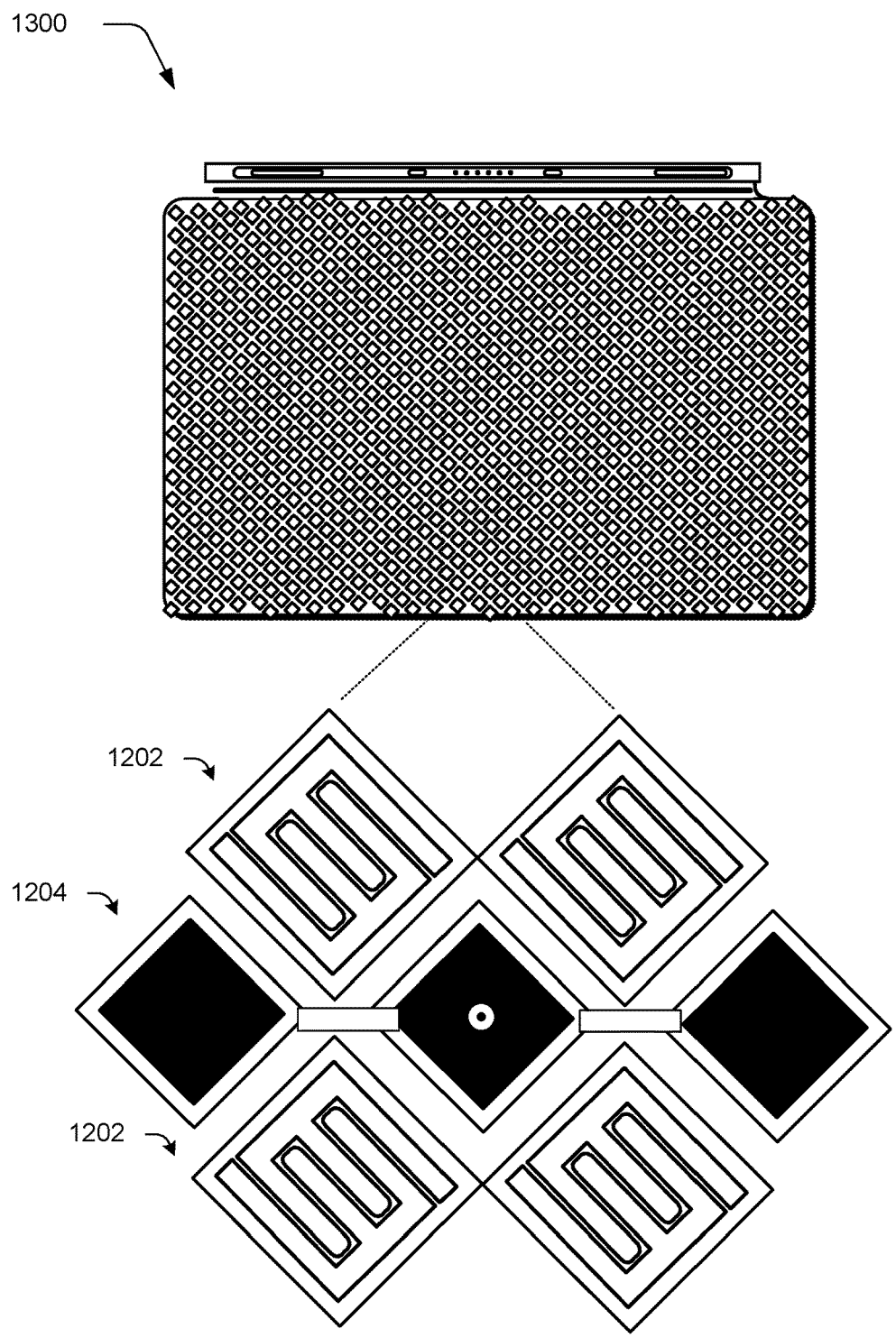
FIG. 13 depicts an example implementation in which pressure sensitive sensor nodes of a pressure sensitive sensor assembly are interspersed with capacitive sensors of a capacitive sensor assembly.

FIG. 13 depicts an example implementation 1300 in which pressure sensitive sensor nodes of a pressure sensitive sensor assembly 1202 are interspersed with capacitive sensors of a capacitive sensor assembly 1204. In this example, the conductors 704 of the pressure sensitive sensor nodes are formed on the sensor substrate 702 as inter-digitated trace fingers as described above. Capacitive trace lines of the capacitive sensor assembly 1204 are also illustrated.

Thus, in this example the pressure sensitive sensor nodes (e.g., sensor nodes) are embedded into a capacitive sensor array to support both capacitive location and pressure input to be reported by the input device 104. Accuracy and linearity of the capacitive sensor assembly 1204 may support a high degree of positional accuracy at virtually non-contact use inputs to support gesturing, mousing movements, and so on.

Additionally, integration of the pressure sensitive sensor nodes of the pressure sensitive sensor assembly 1202 supports pressure readings at each discrete location of capacitive touch events detected by the capacitive sensor assembly 1204. This may also be utilized to support a thin form factor of the input device 104 as a whole that is configured to detect position and pressure at multiple, discrete user inputs. In one or more implementations, conductors of the capacitive sensors and the conductors 704 of the pressure sensitive sensor nodes may be incorporated at the same layer of the input device 104, e.g., the sensor substrate 702 of FIG. 7. Other examples are also contemplated, one such example is described as follows and shown in a corresponding figure.

Figure 14:
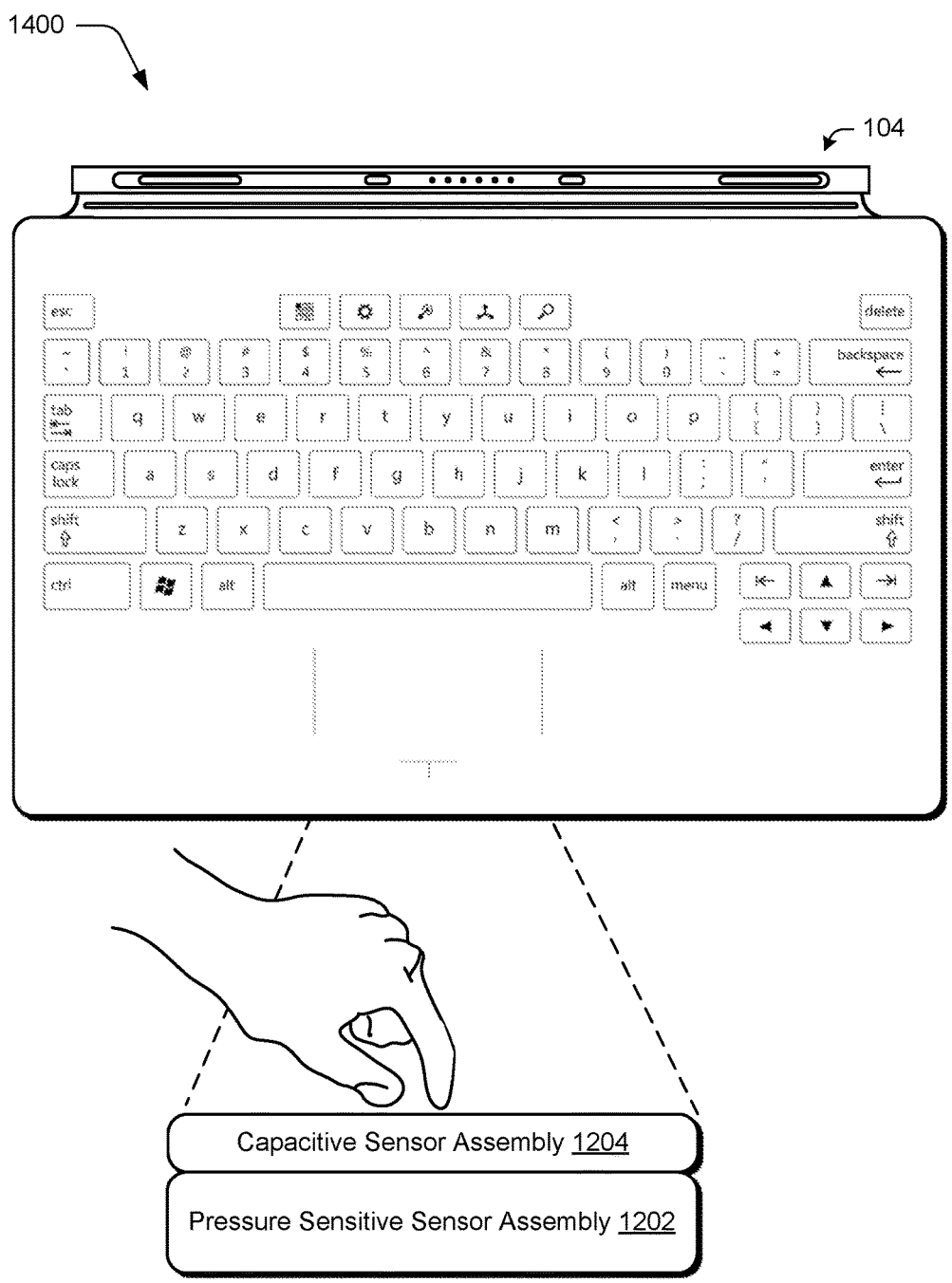
FIG. 14 depicts an example implementation in which the capacitive sensor assembly is configured as a layer and disposed proximal to a layer of a pressure sensitive sensor assembly.

FIG. 14 depicts an example implementation 1400 in which the capacitive sensor assembly 1204 is configured as a layer and disposed proximal to a layer of a pressure sensitive sensor assembly 1202. In this example, the layers are disposed adjacent to each other and are incorporated as part of a track pad, although other configurations are also contemplated. For instance, the capacitive sensor assembly 1204 may be leveraged to detect location as before whereas the pressure sensitive sensor assembly 1202 may be utilized to detect pressure, e.g., a "z" axis input in addition to the "x" and "y" location inputs of the capacitive sensor assembly 1204. In another example, this may be utilized to implement a plurality of keys as part of the track pad that are usable to initiate different inputs in addition to the mousing input supported by the track pad. A variety of other examples are also contemplated without departing from the spirit and scope thereof.

Example System and Device

Figure 15:
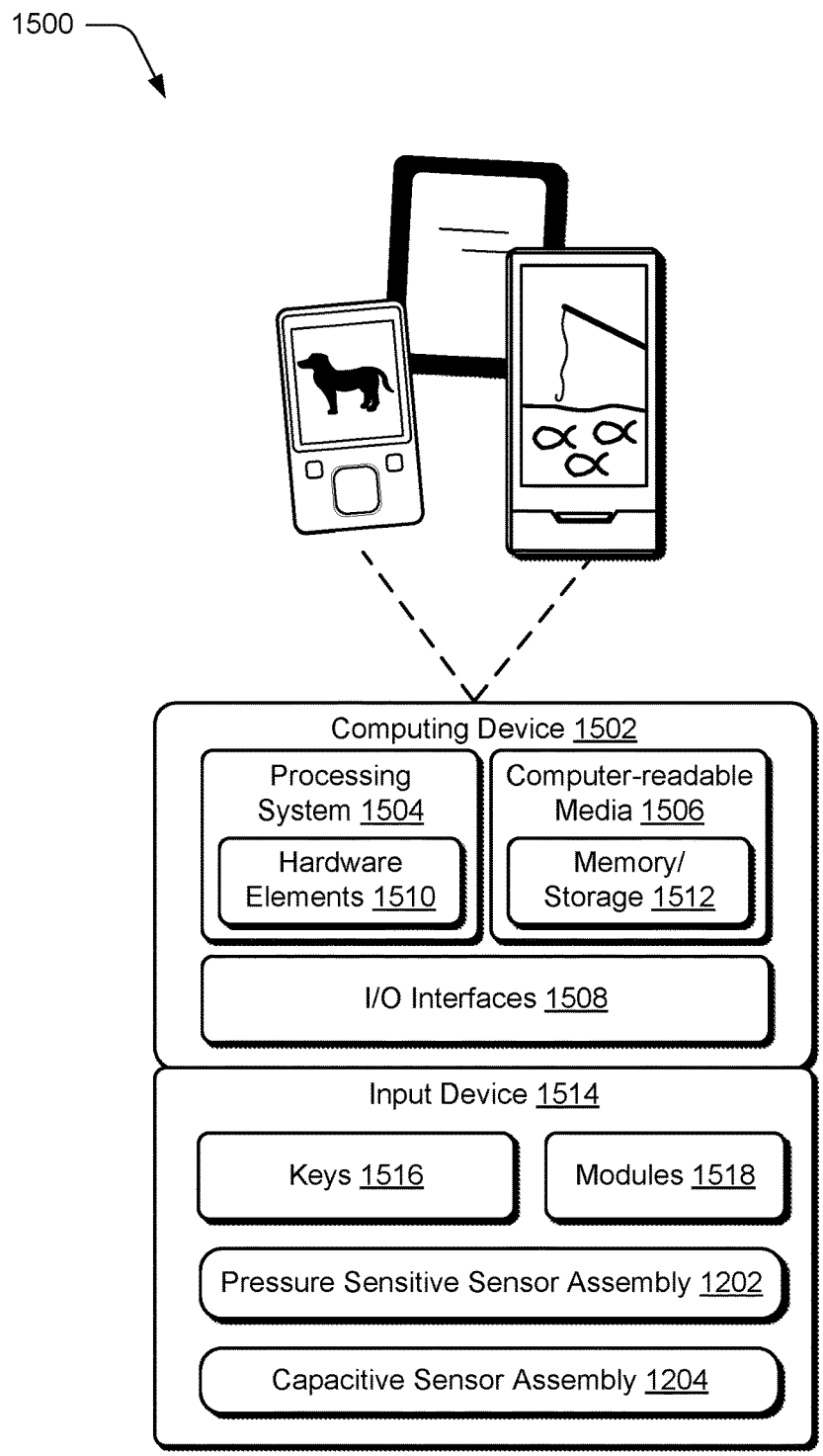
FIG. 15 illustrates an example system generally at that includes an example computing device that is representative of one or more computing systems and/or devices that may implement the various techniques described herein.

FIG. 15 illustrates an example system generally at 1500 that includes an example computing device 1502 that is representative of one or more computing systems and/or devices that may implement the various techniques described herein. The computing device 1502 may be, for example, be configured to assume a mobile configuration through use of a housing formed and size to be grasped and carried by one or more hands of a user, illustrated examples of which include a mobile phone, mobile game and music device, and tablet computer although other examples are also contemplated. The input device 1514 may also be configured to incorporate a pressure sensitive sensor assembly 1202 and a capacitive sensor assembly 1204 as previously described.

The example computing device 1502 as illustrated includes a processing system 1504, one or more computer-readable media 1506, and one or more I/O interface 1508 that are communicatively coupled, one to another. Although not shown, the computing device 1502 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 1504 is representative of functionality to perform one or more operations using hardware. Accordingly, the processing system 1504 is illustrated as including hardware element 1510 that may be configured as processors, functional blocks, and so forth. This may include implementation in hardware as an application specific integrated circuit or other logic device formed using one or more semiconductors. The hardware elements 1510 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable storage media 1506 is illustrated as including memory/storage 1512. The memory/storage 1512 represents memory/storage capacity associated with one or more computer-readable media. The memory/storage component 1512 may include volatile media (such as random access memory (RAM)) and/or nonvolatile media (such as read only memory (ROM), Flash memory, optical disks, magnetic disks, and so forth). The memory/storage component 1512 may include fixed media (e.g., RAM, ROM, a fixed hard drive, and so on) as well as removable media (e.g., Flash memory, a removable hard drive, an optical disc, and so forth). The computer-readable media 1506 may be configured in a variety of other ways as further described below.

Input/output interface(s) 1508 are representative of functionality to allow a user to enter commands and information to computing device 1502, and also allow information to be presented to the user and/or other components or devices using various input/output devices. Examples of input devices include a keyboard, a cursor control device (e.g., a mouse), a microphone, a scanner, touch functionality (e.g., capacitive or other sensors that are configured to detect physical touch), a camera (e.g., which may employ visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 1502 may be configured in a variety of ways to support user interaction.

The computing device 1502 is further illustrated as being communicatively and physically coupled to an input device 1514 that is physically and communicatively removable from the computing device 1502. In this way, a variety of different input devices may be coupled to the computing device 1502 having a wide variety of configurations to support a wide variety of functionality. In this example, the input device 1514 includes one or more keys 1516, which may be configured as pressure sensitive sensor nodes, mechanically switched keys, and so forth.

The input device 1514 is further illustrated as include one or more modules 1518 that may be configured to support a variety of functionality. The one or more modules 1518, for instance, may be configured to process analog and/or digital signals received from the keys 1516 to determine whether a keystroke was intended, determine whether an input is indicative of resting pressure, support authentication of the input device 1514 for operation with the computing device 1502, and so on.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 1502. By way of example, and not limitation, computer-readable media may include "computer-readable storage media" and "computer-readable signal media."

"Computer-readable storage media" may refer to media and/or devices that enable persistent and/or non-transitory storage of information in contrast to mere signal transmission, carrier waves, or signals per se. Thus, computer-readable storage media refers to non-signal bearing media. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" may refer to a signal-bearing medium that is configured to transmit instructions to the hardware of the computing device 1502, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 1510 and computer-readable media 1506 are representative of modules, programmable device logic and/or fixed device logic implemented in a hardware form that may be employed in some embodiments to implement at least some aspects of the techniques described herein, such as to perform one or more instructions. Hardware may include components of an integrated circuit or on-chip system, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 1510. The computing device 1502 may be configured to implement particular instructions and/or functions corresponding to the software and/or hardware modules. Accordingly, implementation of a module that is executable by the computing device 1502 as software may be achieved at least partially in hardware, e.g., through use of computer-readable storage media and/or hardware elements 1510 of the processing system 1504. The instructions and/or functions may be executable/operable by one or more articles of manufacture (for example, one or more computing devices 1502 and/or processing systems 1504) to implement techniques, modules, and examples described herein.

CONCLUSION

Although the example implementations have been described in language specific to structural features and/or methodological acts, it is to be understood that the implementations defined in the appended claims is not necessarily limited to the specific features or acts described. Rather, the specific features and acts are disclosed as example forms of implementing the claimed features.

What is claimed is:

1. An input device comprising:
    a capacitive sensor assembly including a plurality of capacitive sensors disposed on one or more first portions of a sensor substrate, the capacitive sensors configured to detect an object as proximal to a respective capacitive sensor of the capacitive sensor assembly; and
    a pressure sensitive sensor assembly including a plurality of pressure sensitive sensor nodes disposed on one or more second portions of the sensor substrate, the one or more second portions comprising one or more non-overlapping portions of the sensor substrate that are separate from the one or more first portions, the pressure sensitive sensor nodes configured to detect an amount of pressure applied to a respective pressure sensitive sensor node of the pressure sensitive sensor assembly;
    wherein the capacitive sensor assembly and the pressure sensitive sensor assembly are configured as a single layer on the sensor substrate.

2. An input device as described in claim 1, wherein the capacitive sensor assembly is configured to detect a location of the object.

3. An input device as described in claim 1, wherein the capacitive sensor assembly is associated with a palm rest of the input device and the pressure sensitive sensor assembly is associated with keys of a keyboard.

4. An input device as described in claim 1, wherein the pressure sensitive sensor nodes comprise a force sensitive ink.

5. An input device as described in claim 1, wherein the sensor substrate comprises printed circuit board having conductors disposed thereon.

6. An input device as described in claim 1, wherein the pressure sensitive sensor assembly is placed in an operational state responsive to detection of the object to as proximal to a respective capacitive sensor of the capacitive sensor assembly.

7. An input device as described in claim 1, wherein an area of the capacitive sensor assembly is not a track pad.

8. A method comprising:
    detecting that an object is located as proximal to one or more capacitive sensors disposed on one or more first portions of a sensor substrate of an input device;
    detecting pressure applied to one or more pressure sensitive sensor nodes disposed on one or more second portions of the sensor substrate, the one or more second portions comprising one or more non-overlapping portions of the sensor substrate of the input device that are separate from the one or more first portions, wherein the one or more capacitive sensors and the one or more pressure sensitive sensor nodes are configured as a single layer on the sensor substrate; and
    sending one or more inputs corresponding to detection of the object or detection of the pressure.

9. A method as described in claim 8, further comprising detecting, by the one or more capacitive sensors, a location of the object.

10. A method as described in claim 8, wherein the one or more capacitive sensors are associated with a palm rest of the input device and the one or more pressure sensitive sensor nodes are associated with keys of a keyboard.

11. A method as described in claim 8, wherein the one or more pressure sensitive sensor nodes comprise a force sensitive ink.

12. A method as described in claim 8, wherein the sensor substrate comprises printed circuit board having conductors disposed thereon and the one or more inputs are generated by the printed circuit board.

13. A method as described in claim 8, further comprising placing the one or more pressure sensitive sensor nodes in an operational state responsive to detecting that the object as proximal to the one or more capacitive sensors.

14. A sensor assembly configured to provide inputs to a computing device, the sensor assembly comprising:
    a sensor substrate comprising a printed circuit board;
    a pressure sensitive sensor assembly disposed on one or more first portions of the sensor substrate including a plurality of pressure sensitive sensor nodes configured to detect applied pressure; and
    a capacitive sensor assembly disposed on one or more second portions of the sensor substrate, the one or more second portions comprising one or more non-overlapping portions of the sensor substrate that are separate from the one or more first portions, the capacitive sensor assembly including a plurality of capacitive sensors configured to detect presence of a proximal object;
    wherein the capacitive sensor assembly and the pressure sensitive sensor assembly are configured as a single layer on the sensor substrate.

15. A sensor assembly as described in claim 14, wherein the pressure sensitive sensor assembly is associated with a first functionality of an input device and the capacitive sensor assembly is associated with a second functionality of the input device.

16. A sensor assembly as described in claim 15, wherein the first functionality is associated with keys of a keyboard and the second functionality is associated with a track pad.

* * * * *